US007245638B2

(12) United States Patent
Agazzi et al.

(10) Patent No.: US 7,245,638 B2
(45) Date of Patent: Jul. 17, 2007

(54) METHODS AND SYSTEMS FOR DSP-BASED RECEIVERS

(75) Inventors: Oscar Agazzi, Irvine, CA (US); Venugopal Gopinathan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 932 days.

(21) Appl. No.: 10/085,071

(22) Filed: Mar. 1, 2002

(65) Prior Publication Data
US 2002/0080898 A1 Jun. 27, 2002

Related U.S. Application Data

(63) Continuation-in-part of application No. 09/909,896, filed on Jul. 23, 2001.

(60) Provisional application No. 60/273,215, filed on Mar. 1, 2001, provisional application No. 60/219,918, filed on Jul. 21, 2000.

(51) Int. Cl.
H04J 3/06 (2006.01)
(52) U.S. Cl. .................................. 370/516; 375/327
(58) Field of Classification Search ................ None
See application file for complete search history.

(56) References Cited

U.S. PATENT DOCUMENTS

| 5,166,954 A | * | 11/1992 | Grizmala et al. ........... 375/227 |
|---|---|---|---|
| 5,396,224 A | | 3/1995 | Dukes et al. |
| 5,485,490 A | | 1/1996 | Leung et al. |
| 5,550,546 A | | 8/1996 | Noneman et al. |
| 5,554,945 A | | 9/1996 | Lee et al. |
| 5,614,855 A | | 3/1997 | Lee et al. |
| 5,650,954 A | | 7/1997 | Minuhin |
| 5,703,905 A | | 12/1997 | Langberg |
| 5,757,857 A | | 5/1998 | Buchwald |

(Continued)

FOREIGN PATENT DOCUMENTS

EP  0 483 439 A1  5/1992

(Continued)

OTHER PUBLICATIONS

Agazzi, O. and Lenosky, T., "Algorithm to Postprocess Measured Data," *IEEE 802.3ae Equalization Ad Hoc Group*, IEEE, Jan. 10, 2001, 11 pages.

(Continued)

*Primary Examiner*—Duc Ho
(74) *Attorney, Agent, or Firm*—Sterne, Kessler, Goldstein & Fox P.L.L.C.

(57) ABSTRACT

Digital signal processing based methods and systems for receiving data signals include parallel receivers, multi-channel receivers, timing recovery schemes, and, without limitation, equalization schemes. The present invention is implemented as a multi-path parallel receiver in which an analog-to-digital converter ("ADC") and/or a digital signal processor ("DSP") are implemented with parallel paths that operate at lower rates than the received data signal. In an embodiment, a parallel DSP-based receiver in accordance with the invention includes a separate timing recovery loop for each ADC path. In an embodiment, a parallel DSP-based receiver includes a separate automatic gain control (AGC) loop for each ADC path. In an embodiment, a parallel DSP-based receiver includes a separate offset compensation loop for each ADC path. In an embodiment the present invention is implemented as a multi-channel receiver that receives a plurality of data signals.

63 Claims, 29 Drawing Sheets

U.S. PATENT DOCUMENTS

| | | | |
|---|---|---|---|
| 5,768,268 | A | 6/1998 | Kline et al. |
| 5,822,143 | A | 10/1998 | Cloke et al. |
| 5,881,107 | A | 3/1999 | Termerinac et al. |
| 5,881,108 | A | 3/1999 | Herzberg et al. |
| 5,945,862 | A | 8/1999 | Donnelly et al. |
| 5,949,820 | A | 9/1999 | Shih et al. |
| 5,966,415 | A | 10/1999 | Bliss et al. |
| 5,996,415 | A | 12/1999 | Stanke et al. |
| 6,002,279 | A | 12/1999 | Evans et al. |
| 6,005,445 | A | 12/1999 | Katakura |
| 6,009,534 | A | 12/1999 | Chiu et al. |
| 6,038,269 | A | 3/2000 | Raghavan |
| 6,122,336 | A | 9/2000 | Anderson |
| 6,134,268 | A | 10/2000 | McCoy |
| 6,329,859 | B1 | 12/2001 | Wu |
| 6,359,486 | B1 | 3/2002 | Chen |
| 6,359,923 | B1* | 3/2002 | Agee et al. ................. 375/130 |
| 6,397,048 | B1 | 5/2002 | Toda |
| 6,404,525 | B1 | 6/2002 | Shimomoura et al. |
| 6,498,694 | B1 | 12/2002 | Shah |
| 6,509,773 | B2 | 1/2003 | Buchwald et al. |
| 6,587,529 | B1* | 7/2003 | Staszewski et al. ......... 375/371 |
| 6,621,862 | B1 | 9/2003 | Dabell |
| 6,721,371 | B1* | 4/2004 | Barham et al. ............. 375/316 |
| 6,791,388 | B2 | 9/2004 | Buchwald et al. |
| 6,894,489 | B2* | 5/2005 | Makuuchi et al. .......... 324/212 |
| 2002/0012152 | A1 | 1/2002 | Agazzi et al. |
| 2002/0034222 | A1 | 3/2002 | Buchwald et al. |
| 2002/0039395 | A1 | 4/2002 | Buchwald et al. |
| 2002/0044617 | A1 | 4/2002 | Buchwald et al. |
| 2002/0044618 | A1 | 4/2002 | Buchwald et al. |
| 2002/0122503 | A1* | 9/2002 | Agazzi ....................... 375/316 |
| 2003/0086515 | A1 | 5/2003 | Trans et al. |
| 2004/0212416 | A1 | 10/2004 | Buchwald et al. |

FOREIGN PATENT DOCUMENTS

| | | |
|---|---|---|
| EP | 0 515 074 | 11/1992 |
| EP | 0 805 447 A2 | 11/1997 |
| EP | 0 909 035 | 4/1999 |
| EP | 1 006 697 A2 | 6/2000 |
| EP | 1 139 619 A1 | 10/2001 |
| WO | WO 01/29991 A2 | 4/2001 |
| WO | WO 01/54317 A2 | 7/2001 |
| WO | WO 01/65788 A2 | 9/2001 |
| WO | WO 01/84702 | 11/2001 |
| WO | WO 01/84724 | 11/2001 |
| WO | WO 02/13424 A2 | 2/2002 |
| WO | WO 02/071616 | 9/2002 |

OTHER PUBLICATIONS

Agazzi, O., "A Link Model for Equalized Optical Receivers," *IEEE 802.3ae Equalization Ad Hoc Group*, IEEE, Mar. 11, 2001, 30 pages.

Agazzi, O. et al., "DSP-Based Equalization for Optical Channels: Feasibility of a VLSI Implementation," *IEEE 802.3ae*, New Orleans, IEEE, Sep. 12-14, 2000, 39 pages.

Agazzi, O. et al., "Interim Observations on Multimode Optical Channels," *IEEE 802.3ae—Equalization Ad Hoc*, IEEE, Tampa, Nov. 5, 2000, 29 pages.

Agazzi, O. et al., "Measurement of DMD-Challenged Fibers at 3.125Gb/s," *IEEE 802.3ae Equalization Ad Hoc*, IEEE, Jan. 10, 2001, 33 pages.

Agazzi, O. and Lenosky, T., "Measurement of Non-Stationarity of 10 Gb/s Multimode Fiber Links," *IEEE 802.3ae Equalization Ad Hoc*, IEEE, Nov. 24, 2000, 5 pages.

Agazzi, O., "10 Gb/s PMD Using PAM-5 Modulation," *IEEE 802.3*, IEEE, Dallas, Jan. 18-20, 2000, 19 pages.

Agazzi, O. et al., "10 Gb/s PMD Using PAM-5 Trellis Coded Modulation," *IEEE 802.3*, IEEE, Alburquerque, Mar. 6-10, 2000, 38 pages.

Bhatt, V., "Equalization Ad Hoc Concluding Report," *IEEE P802.3ae Plenary*, IEEE, Mar. 2001, 12 pages.

Bingham, J.A.C., "Multicarrier Modulation for Data Transmission: An Idea Whose Time Has Come," *IEEE Communications Magazine*, IEEE, vol. 28, No. 5, pp. 5-8 and 11-14.

Chiddix, J. et al., "AM Video on Fiber in CATV Systems: Need and Implementation," *IEEE Journal on Selected Areas in Communications*, IEEE, vol. 8, No. 7, Sep. 1990, pp. 1229-1239.

Darcie, T., "Subcarrier Multiplexing for Lightwave Networks and Video Distribution Systems," *IEEE Journal on Selected Areas in Communications*, IEEE, vol. 8, No. 7, Sep. 1990, pp. 1240-1248.

Fettweis, G., "High-Rate Viterbi Processor: A Systolic Array Solution," *IEEE Journal on Selected Areas in Communications*, IEEE, vol. 8, No. 8, Oct. 1990, pp. 1520-1534.

Fettweis, G., "Parallel Viterbi Algorithm Implementation: Breaking the ACS-Bottleneck," *IEEE Transactions on Communications*, IEEE, vol. 37, No. 8, Aug. 1989, pp. 785-790.

Forney, Jr., G.D., "The Viterbi Algorithm," *Proceedings of the IEEE*, IEEE, vol. 61, No. 3, Mar. 1973, pp. 268-278.

Frazier, H., "IEEE 802.3 Higher Speed Study Group," *10 Gig MII update*, IEEE, Kauai, Hawaii, Nov. 9, 1999, 24 pages.

Giaretta, G. and Lenosky, T., "Adaptive Equalization of DMD Challenged Multimode Fiber at 1300 mm," *IEEE P802.3ae Plenary*, IEEE, Mar. 11, 2001, 10 pages.

Hatamian, M. et al., "Design Considerations for Gigabit Ethernet 1000Base-T Twisted Pair Transceivers," *IEEE 1998 Custom Integrated Circuits Conference*, IEEE, 1998, pp. 335-342.

Isaacs, M et al., "Measurements of Fiber Responses at 5 Gb/s Data Rate Using 850nm VCSELs," *IEEE 802.3ae Equalization Ad Hoc*, IEEE, Mar. 11, 2001, 18 pages.

Kanno, N. and Ito, K., "Fiber-Optic Subcarrier Multiplexing Video Transport Employing Multilevel QAM," *IEEE Journal on Selected Areas in Communications*, IEEE, vol. 8, No. 7, Sep. 1990, pp. 1313-1319.

Kasper, B.L., "Equalization of Multimode Optical Fiber Systems," *The Bell System Technical Journal*, American Telephone and Telegraph Company, IEEE, vol. 61, No. 7, Sep. 1982, pp. 1367-1388.

Kasturia, S. and Winters, J., "Techniques for High-Speed Implementation of Nonlinear Cancellation," *IEEE Journal on Selected Areas in Communications*, IEEE, vol . 9, No. 5, Jun. 1991, pp. 711-717.

Lenosky, T., "A Unified Method of Calculating PMD-induced Pulse Broadening," *IEEE 802.3ae Equalization Ad Hoc Meeting*, IEEE, Tampa, Florida, Nov. 5, 2000, 8 pages.

Lenosky, T. and Giaretta, G., "Five Gb/s Multimode DMD at 850 nm: Real-Time Data and Equalizer Simulations," *Finisar Corporation*, Mar. 11, 2001, 13 pages.

Lenosky, T. et al., "Measurements of DMD-Challenged Fibers at 850nm and 2Gb/s Data Rate," *IEEE 802.3ae—Equalization Ad Hoc Group*, IEEE, Jan. 10. 2001, 21 pages.

Lenosky, T. et al., "Measurement of DMD-Challenged Fibers at 1310nm and 1Gb/s Data Rate," *IEEE 802.3ae—Equalization Ad Hoc Group*, IEEE, Jan. 10. 2001, 21 pages.

Liu, M-K. and Modestou, P., "Multilevel Signaling and Pulse Shaping for Spectrum Efficiency in Subcarrier Multiplexing Transmission," *IEEE Journal of Lightwave Technology*, IEEE, vol. 12, No. 7, pp. 1239-1246.

Olshansky, R. et al., "Subcarrier Multiplexed Coherent Lightwave Systems for Video Distribution," *IEEE Journal on Selected Areas in Communications*, IEEE, vol. 8, No. 7, Sep. 1990, pp. 1268-1275.

Olshansky, R. et al., "Subcarrier Multiplexed Lightwave Systems for Broadband Distribution," *IEEE Journal of Lightwave Technology*, IEEE, vol. 7, No. 9, Sep. 1989, pp. 1329-1341.

Otte, S. and Rosenkranz, W., "A Decision Feedback Equalizer for Dispersion Compensation in High Speed Optical Transmission Systems," *International Conference on Transparent Optical Networks*, IEEE, 1999, pp. 19-22.

Parhi, K. et al., "Parallel Implementation of the DSP Functions of the PAM-5 10Gb/s Transceiver," *IEEE 802.3ae Task Force*, IEEE, Mar. 2000, 12 pages.

Peral, E. et al., "Measurements of the time variation in DMD-challenged multimode fiber at 1310nm for 10GE equalizer applications.," *IEEE P802.3ae Equalization Ad Hoc*, IEEE, Mar. 2001, 19 pages.

Personick, S.D., "Baseband Linearity and Equalization in Fiber Optic Digital Communication Systems," *Bell System Technical Journal*, American Telephone and Telegraph Company, vol. 52, No. 7, Sep. 1973, pp. 1175-1194.

Personick, S.D., "Receiver Design for Digital Fiber Optic Communication Systems, I," *Bell System Technical Journal*, American Telephone and Telegraph Company, vol. 52, No. 6, Jul.-Aug. 1973, pp. 843-874.

Personick, S.D., "Receiver Design for Digital Optic Systems," *National Telecommunications Conference*, IEEE, Atlanta, Georgia, Nov. 26-28, 1973, vol. 1, pp. 8E-1-8E-4.

Vorenkamp, P. et al., "Analog Interface for 10-Gb/s Ethernet," *IEEE 802.3ae Task Force*, IEEE, Mar. 2000, 13 pages.

Winters, J. and Gitlin, R., "Electrical Signal Processing Techniques in Long-Haul Fiber-Optic Systems," *IEEE Transactions on Communications*, IEEE, vol. 38, No. 9, Sep. 1990, pp. 1439-1453.

Winters, J. et al., "Reducing the Effects of Transmission Impairments in Digital Fiber Optic Systems," *IEEE Communications Magazine*, IEEE, Jun. 1993, pp. 68-76.

"Progress Report on Equalization of Multimode Fibers," *Ad Hoc Group on Equalization*, IEEE, Jan. 12, 2001, 16 pages.

Alderrou, D. et al., "XAUI/XGXS Proposal," *IEEE 802.3ae Task Force*, IEEE, May 23-25, 2000, 28 pages.

Winters, J.H. and Gitlin, R., "Electrical Signal Processing Techniques in Long-Haul, Fiber-Optic Systems," *IEEE International Conference on Communications*, IEEE, vol. 1, Apr. 16-19, 1990, pp. 0397-0403.

Buchwald, A. and Martin, K., *Integrated Fiber-Optic Receivers*, Kluwer Academic Publishers, ISBN 0-7923-9549-2, Copyright 1995 (entire book submitted).

Sidiropoulos, S. and Horowitz, M. A., "A Semidigital Dual Delay-Locked Loop," *IEEE Journal of Solid-State Circuits*, IEEE, vol. 32, No. 11, Nov. 1997, pp. 1683-1692.

International Search Report for PCT Application No. PCT/US02/06019, filed Mar. 1, 2002, 7 pages (mailing date of search report—Aug. 1, 2003).

Black, Jr., W. and Hodges, D., "Time Interleaved Converter Arrays," *IEEE Journal of Solid-State Circuits*, IEEE, vol. SC-15, No. 6, Dec. 1980, pp. 1022-1029.

Conroy, C. et al., "An 8-b 85-MS/s Parallel Pipeline A/D Converter in 1-μm CMOS," *IEEE Journal of Solid-State Circuits*, IEEE, vol. 28, No. 4, Apr. 1993, pp. 447-454.

Dally, W. and Poulton, J., "Transmitter Equalization for 4Gb/s Signalling," *Proceedings of Hot Interconnects IV*, Palo Alto, CA, 1996, 10 pages.

Ellersick, W. et al., "A Serial-Link Transceiver Based on 8GSample/s A/D and D/A Converters in 0.25 μm CMOS," *IEEE International Solid-State Circuits Conference*, IEEE, 2001, p. 58-59 and 430.

Ellersick, W. et al., GAD: A 12-GS/s CMOS 4-bit A/D Converter for an Equalized Multi-Level Link, *Symposium on VLSI Circuits Digest of Technical Papers*, 1999, pp. 49-52.

Eklund, J-E. and Gustafsson, F., "Digital Offset Compensation of Time-Interleaved ADC Using Random Chopper Sampling," *IEEE International Symposium on Circuits and Systems*, IEEE, May 28-31, 2000, pp. II-447-450.

Fu, D. et al., "A Digital Background Calibration Technique for Time-Interleaved Analog-to-Digital Converters," *IEEE Journal of Solid-State Circuits*, IEEE, vol. 33, No. 12, Dec. 1998, pp. 1904-1911.

Guizani, M. and Al-Ali, A., "PC-Compatible Optical Data Acquisition Unit," *Instrumentation and Measurement Technology Conference*, IEEE, May 10-12, 1994, pp. 1099-1102.

Jenq, Y-C., "Digital Spectra of Nonuniformity Sampled Signals: A Robust Sampling Time Offset Estimation Algorithm for Ultra High-Speed Waveform Digitizers Using Interleaving," *Transactions on Instrumentation and Measurement*, IEEE, vol. 39, No. 1, Feb. 1990, pp. 71-75.

Mason, R. and Taylor, J.T., "High-Speed Electro-Optic Analogue to Digital Converters," *IEEE International Symposium on Circuits and Systems*, IEEE, 1993, pp. 1081-1084.

Niewczas, P. et al., "Error Analysis of an Optical Current Transducer Operating with a Digital Signal Processing System," *IEEE Transactions on Instrumentation and Measurement*, IEEE, vol. 49, No. 6, Dec. 2000, pp. 1254-1259.

Petraglia, A. and Mitra, S., "Analysis of Mismatch Effects Among A/D Converters in a Time-Interleaved Waveform Digitizer," *IEEE Transactions on Instrumentation and Measurement*, IEEE, vol. 40, No. 5, Oct. 1991, pp. 831-835.

Sauer-Greff, W. et al., "Maximum-Likelihood Sequence Estimation of Nonlinear Channels in High-Speed Optical Fiber Systems," Apr. 6, 2001. Retrieved from the Internet: <URL: http://www.ftw.at/Dokumente/010406a.pdf, 29 pages.

Williamson, R.C. et al., "Effects of Crosstalk in Demulitplexers for Photonic Analog-to-Digital Converters," *Journal of Lightwave Technology*, IEEE, vol. 19, No. 2, Feb. 2001, pp. 230-236.

Yang, C-K., "Design Techniques for High-Speed Chip-to-Chip Links," Retrieved from the Internet:<URL: http://web.doe.carleton.ca/courses/97578/topic5/Tutorial_SerialLink.pdf, 31 pages.

Yang, C-K. et al., "A Serial-Link Transceiver Based on 8-Gsamples/s A/D and D/A Converters in 0.25-μm CMOS," *IEEE Journal of Solid-State Circuits*, IEEE, vol. 36, No. 11, Nov. 2001, pp. 1684-1692.

Zuoxi, T., "Implementation of a Digital Multibeam Receiver Based on TMS320C80 for Laser Optoacoustic Remote Sensing," *Proceedings of ICSP2000*, IEEE, 2000, pp. 2082-2084.

Izzard, M. J. et al., "Analog versus Digital Control of a Clock Synchronizer for a 3 GB/s Data with 3.0V Differential ECL," *1994 Symposium on VLSI Circuits Digest of Technical Papers*, IEEE, pp. 39-40.

Schmidt, L. and Rein, H.-M., "Continuously Variable Gigahertz Phase-Shifter IC Covering more than One Frequency Decade," *IEEE Journal of Solid-State Circuits*, vol. 27, No. 6, pp. 854-862, Jun. 1992.

\* cited by examiner

FIG. 11 Timing Recovery 4-state M-step trellis (runs at a clock rate equal to 1/M of the symbol rate)

4-state 1-step trellis (runs at a clock rate equal to the symbol rate)

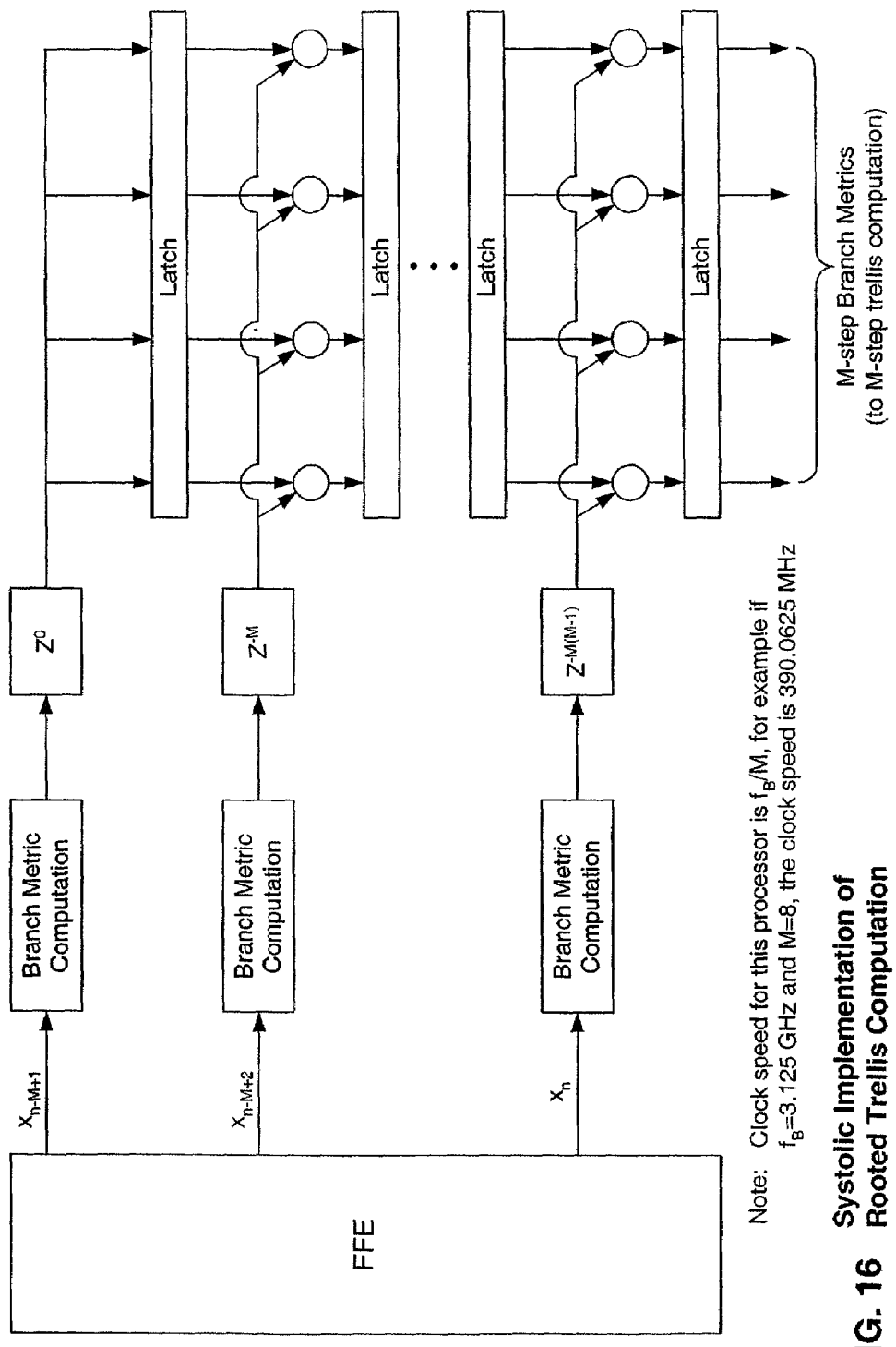
FIG. 16  Systolic Implementation of Rooted Trellis Computation

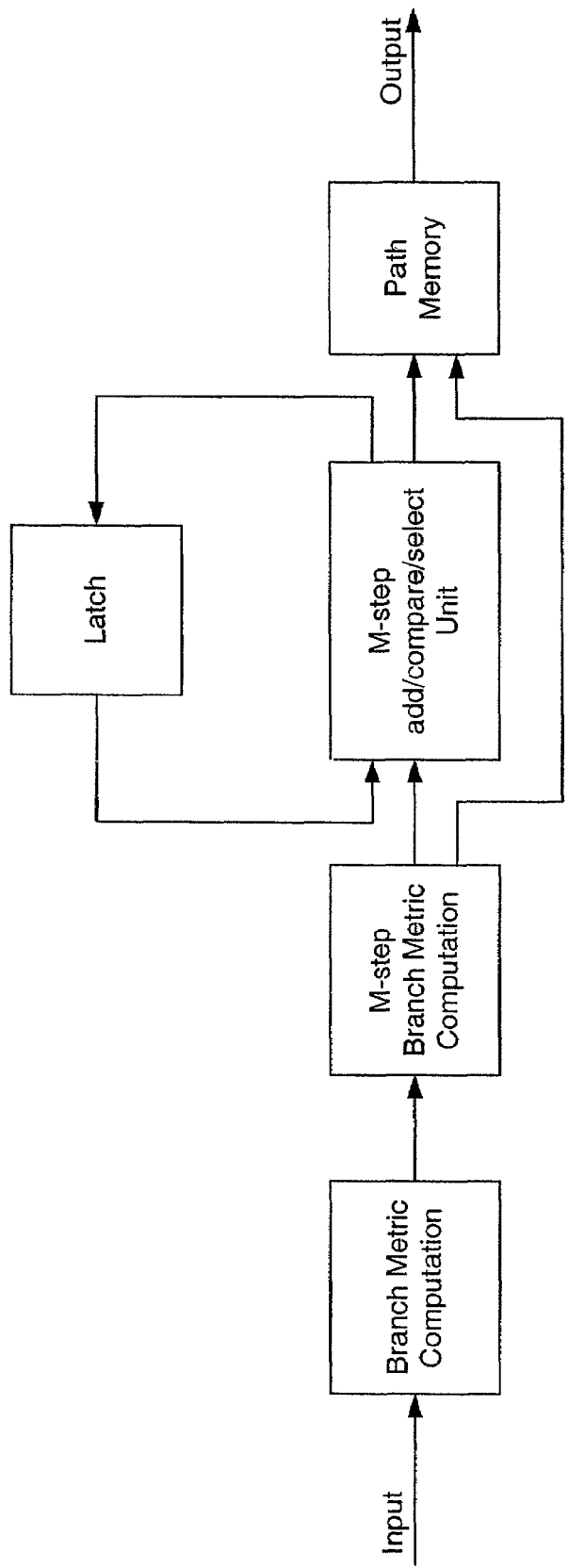
FIG. 17 Overall Block Diagram of Parallel Viterbi Processor

METHODS AND SYSTEMS FOR DSP-BASED RECEIVERS

CROSS-REFERENCE TO RELATED APPLICATIONS

This application claims priority to U.S. Provisional Application No. 60/273,215, filed Mar. 1, 2001, titled "High-Speed Analog to Digital Conversion System for Communications Applications," incorporated herein by reference in its entirety. The application is a Continuation-In-Part of U.S. patent application Ser. No. 09/909,896, titled "Methods and Systems for Digitally Processing Optical Data Signals, which claims priority to U.S. Provisional Application No. 60/219,918, filed Jul. 21, 2000, titled "Wave-Division-Multiplexed Transceiver Using Digital Signal Processing," and to U.S. Provisional Application No. 60/273,215, filed Mar. 1, 2001, titled "High-Speed Analog to Digital Conversion System for Communications Applications," all of which are incorporated herein by reference in their entireties.

BACKGROUND OF THE INVENTION

1. Field of the Invention

The present invention is directed to receivers and, more particularly, to digital signal processing ("DSP") based receivers, and more particularly still, to high speed multi-path analog-to-digital converters ("ADCs") and high data rate multi-path DSPs.

2. Related Art

There is an ever-increasing need for higher speed communications systems. In order to reduce costs, communications systems are increasingly implemented using Very Large Scale Integration (VLSI) techniques. The level of integration of communications systems is constantly increasing to take advantage of advances in integrated circuit manufacturing technology and the resulting cost reductions. This means that communications systems of higher and higher complexity are being implemented in a smaller and smaller number of integrated circuits. For reasons of cost and density of integration, the preferred technology is CMOS.

Digital Signal Processing (37 DSP") techniques generally allow higher levels of complexity and easier scaling to finer geometry technologies than analog techniques, as well as superior testability and manufacturability. However, DSP based communications systems require, for their implementation, an analog-to-digital converter ("ADC"). In many applications, the ADC is challenging to design. In the extreme, the ADC requirements sometimes limit the practicality of building DSP-based communications systems. One such case occurs when the speed of the communication system is very high, for example in the multi-gigabit per second range.

There is growing demand for communications systems that operate at data rates in the multi-gigabit per second range. Examples of such systems are transceivers for optical communications for standards such as OC-48, OC-192, and OC-768, 10 gigabit Ethernet, Fibre Channel, etc. Another example is a transmission system where the communication channel is a transmission line on a printed circuit ("PC") board. These communications systems typically operate over short distances and they are used to interconnect chips on a PC board or on different PC boards across a back plane in a rack-based system. These systems typically operate at data rates of several gigabits per second, and there is a need to increase the speed to the limits allowed by the technology. Additional examples include: transmission systems operating over short lengths of coaxial, twisted pair, or twin-ax cable; and very short reach ("VSR") applications, such as from one equipment rack to another.

Conventional communications systems have limited ADC speeds and limited digital signal processing speeds. Therefore, there is a need for methods and systems for high speed analog-to-digital conversion and for high speed digital signal processing.

BRIEF SUMMARY OF THE INVENTION

The present invention is directed to receivers and, more particularly, to digital signal processing ("DSP") based receivers, high speed multi-path analog-to-digital converters ("ADCs"), and high data rate multi-path DSPs. Aspects of the present invention include, among other things, and without limitation, coding and error correcting schemes, timing recovery schemes, and equalization schemes.

In an embodiment, the present invention is implemented as a multi-path parallel receiver in which an analog-to-digital converter ("ADC") and/or a digital signal processor ("DSP") are implemented with parallel paths that operate at lower rates than the received data signal. In an embodiment, a receiver ADC is configured with N parallel paths and a receiver DSP is configured with M parallel paths, where M=kN, wherein k is an integer or a number of the form 1/s, where s is an integer. In an embodiment, the parallel ADC paths are operated in an interleaved fashion. In parallel implementations, one or more DSP and/or analog processes, including, without limitation, one or more processes that compensate for nonidealities in the analog front-end paths, can be performed on a per path basis, as described below.

In an embodiment, a parallel DSP-based receiver in accordance with the invention includes a separate timing recovery loop for each ADC path. The separate timing recovery loops can be used to compensate for timing phase errors in the clock generation circuit that are different for each path. In an embodiment, phase compensation is performed with a phase interpolator or phase selector.

In an embodiment, a parallel DSP-based receiver in accordance with the invention includes a separate automatic gain control (AGC) loop for each ADC path. The separate AGC loops can be used to compensate for gain errors on a path-by-path basis.

In an embodiment, a parallel DSP-based receiver in accordance with the invention includes a separate offset compensation loop for each ADC path. The separate offset compensation loops can be used to independently compensate for offsets that are different for each path.

In accordance with the invention, one or more adaptive processes are implemented to correct for ADC impairments. For example, one or more processes, such as timing recovery, phase error correction, gain error correction, offset compensation, and/or equalization, are implemented as adaptive processes and/or systems that adapt to reduce error. Error is used in one or more feedback loops, for example, to generate equalizer coefficients, to optimize ADC sampling phase(s) for timing recovery, and/or to optimize gain for automatic gain control ("AGC"). Error correction can be used for other processes as well.

Error can be computed in one or more of a variety of ways. For example, error can be computed as a difference between input signals and decisions as to the values of the input signals. This is referred to herein as a decision-directed process. Decision-directed processes can be implemented with a slicer. Alternatively, decision-directed processes can be implemented with a Viterbi Decoder. Other decision-directed processes can be used as well. Other error determination processes can also be used.

Examples are provided herein, which typically illustrate timing recovery, AGC, and offset cancellation algorithms as decision-directed processes, where error is computed at a slicer or equivalent decision device, such as Viterbi decoder. The examples are provided for illustrative purposes and are not limiting. Based on the teachings herein, one skilled in the relevant art(s) will understand that the techniques can be implemented with non-decision-directed processes as well, and/or in combinations of decision-directed and non-decision-directed processes.

In an embodiment the present invention is implemented as a multi-channel receiver that receives a plurality of data signals.

In accordance with aspects of the invention, one or more of the following types of equalization are performed, alone and/or in various combinations with one another:

Viterbi equalization;

feed-forward equalization ("FFE"); and/or decision feed-back equalization ("DFE").

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE FIGURES

The present invention will be described with reference to the accompanying drawings. The drawing in which an element first appears is typically indicated by the leftmost digit(s) in the corresponding reference number.

FIG. 16 illustrates an example systolic implementation of rooted trellis computation, in accordance with an aspect the present invention.

FIG. 17 is a high-level block diagram of an example parallel Viterbi processor in accordance with an aspect the present invention.

DETAILED DESCRIPTION OF THE INVENTION

Table Of Contents

I. Introduction
   A. Receivers and Transceivers
   B. Equalization

II. High Speed, DSP-Based Receiver
   A. Parallel ADC and DSP

III. Design and Control Considerations
   A. Path-Based Timing Recovery and Phase Error Compensation
      1. Decision-Directed Timing Recovery
      2. Phase Selector
         a. DAC-Based Phase Selector
         b. Resistive Interpolation Ring
   B. Gain and Offset Mismatch Compensation
      1. DSP-Based Adaptive Path Gain and Offset Mismatch Control
      2. Automatic Gain Control (AGC)
      3. Analog Compensation
      4. Alternative Implementations IV. Parallel Equalization
   A. Parallelization of a Viterbi Decoder V. Error Correction VI. Methods of Operation VII. Conclusions

I. Introduction

A. Receivers and Transceivers

The present invention is directed to receivers and, more particularly, to digital signal processing ("DSP") based receivers, multi-channel receivers, timing recovery schemes, and equalization schemes. Various features in accordance with the present invention are described herein. The various features can generally be implemented alone and/or in various combinations with one another. Example implementations of various combinations of features of the invention are provided herein. The invention is not, however, limited to these examples. Based on the description herein, one skilled in the relevant art(s) will understand that the features described herein can be practiced alone and or in other combinations as well.

Figure 1:
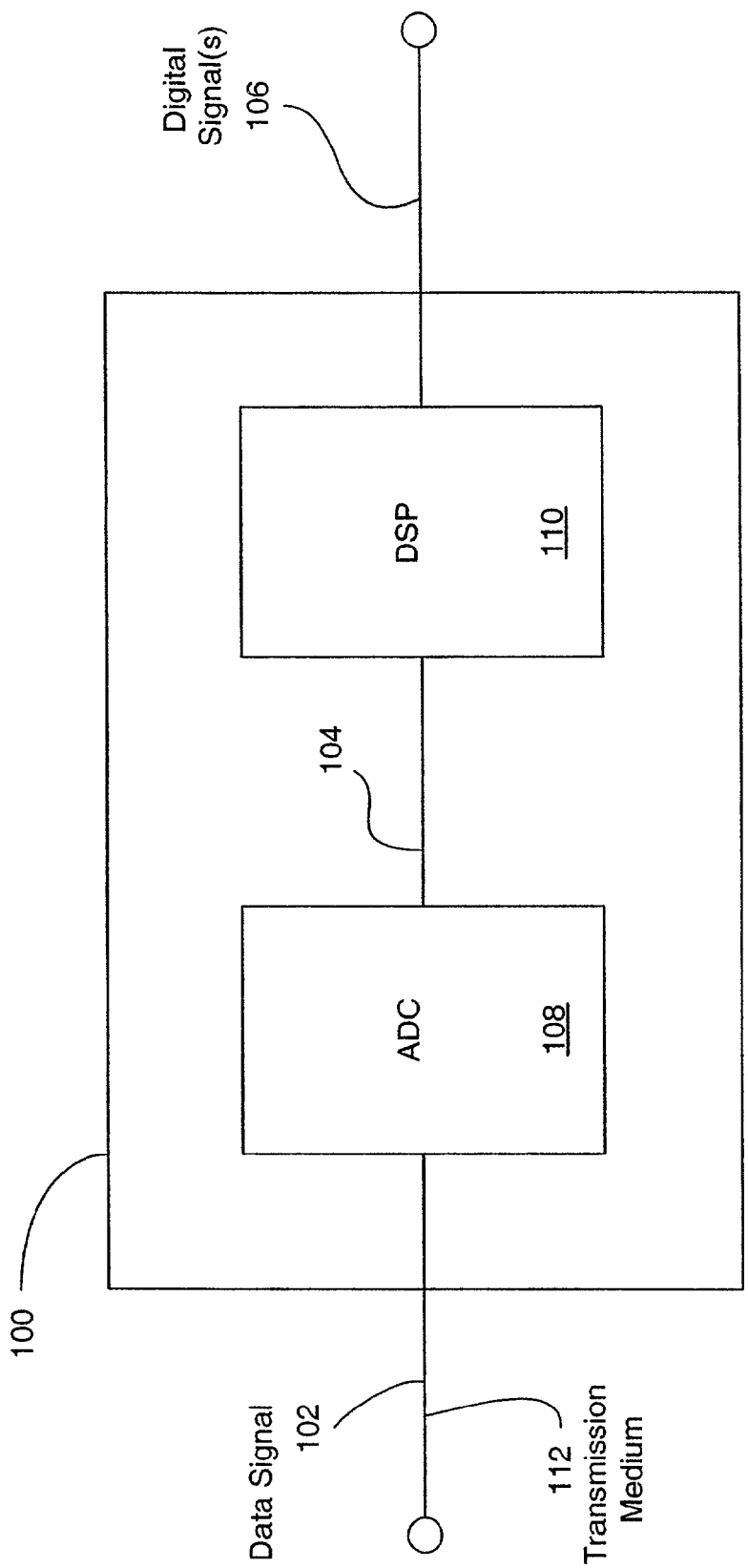
FIG. 1 is a high level block diagram of a DSP-based receiver, in accordance with an aspect of the present invention.

FIG. 1 is a high-level block diagram of an example DSP-based receiver 100, in accordance with the present invention. The DSP-based receiver 100 receives a data signal 102 through a transmission medium 112 and converts it to a digital data signal 106.

The DSP-based receiver 100 includes an analog-to-digital converter ("ADC") 108 that digitizes the data signal 102 and outputs one or more internal digital signals 104. The DSP-based receiver 100 also includes a DSP 110 that performs one or more digital signal processes on the one or more digital signals 104, and outputs one or more digital output signals 106.

DSP processes in accordance with the present invention are described below, which can include, without limitation, equalization, error correction (such as hard or soft decoding of, without limitation, convolutional, trellis, or block codes), timing recovery, automatic gain control, and offset compensation. Analog circuitry (not shown in FIG. 1) is optionally provided to perform portions of one or more of these functions.

In an embodiment, the ADC 108 and/or the DSP 110 are implemented with multiple parallel paths, wherein each parallel path operates at a lower speed relative to the data signal 102. In an embodiment, the parallel paths are operated in an interleaved fashion as described below. In an embodiment, the ADC 108 is configured with N parallel paths and the DSP 110 is configured with M parallel paths, where M=kN, wherein k is an integer or a number in the form of 1/s, where s is an integer. In parallel implementations, one or more DSP and/or analog processes, including, without limitation, one or more processes that compensate for non-idealities in the analog front-end paths, can be performed on a per path basis, as described below.

B. Equalization

Optional equalization of data signals is now described with respect to FIG. 1. During operation of the DSP-based receiver 100, the data signal 102 is received by the receiver 100 through the transmission medium 112. During transmission through the transmission medium 112, the data signal 102 is typically impaired, due to inter-symbol interference, attenuation, crosstalk, noise, and possibly other impairments. These impairments are typically a function of, among other things, physical properties and the length of the transmission medium 112. These impairments are said to reduce the "eye opening" of the data signal 102, making it more difficult to accurately process the data signal 102.

In an embodiment, the receiver 100 includes one or more equalizers (not shown), which may include, without limitation, linear equalizers and/or non-linear equalizers. The one or more equalizers improve the "eye opening" of the data signal 102. The present invention provides parallel and non-parallel equalization embodiments.

In an embodiment the one or more equalizers perform one or more of the following types of equalization:
   feed forward equalization ("FFE");
   Viterbi equalization; and/or
   decision feedback equalization ("DFE").

In accordance with an aspect of the invention, equalization, including linear and/or non-linear equalization, is performed.

In an embodiment, error correction such as, without limitation, hard or soft decoding of convolutional, trellis, or block codes is implemented in a multi-path receiver.

Example implementations in accordance with aspects of the invention are described below. Any of a variety of conventional parallel implementation techniques and/or new techniques in accordance with the invention, or combinations thereof, can be implemented in a parallel multi-path receiver.

Figure 3A:
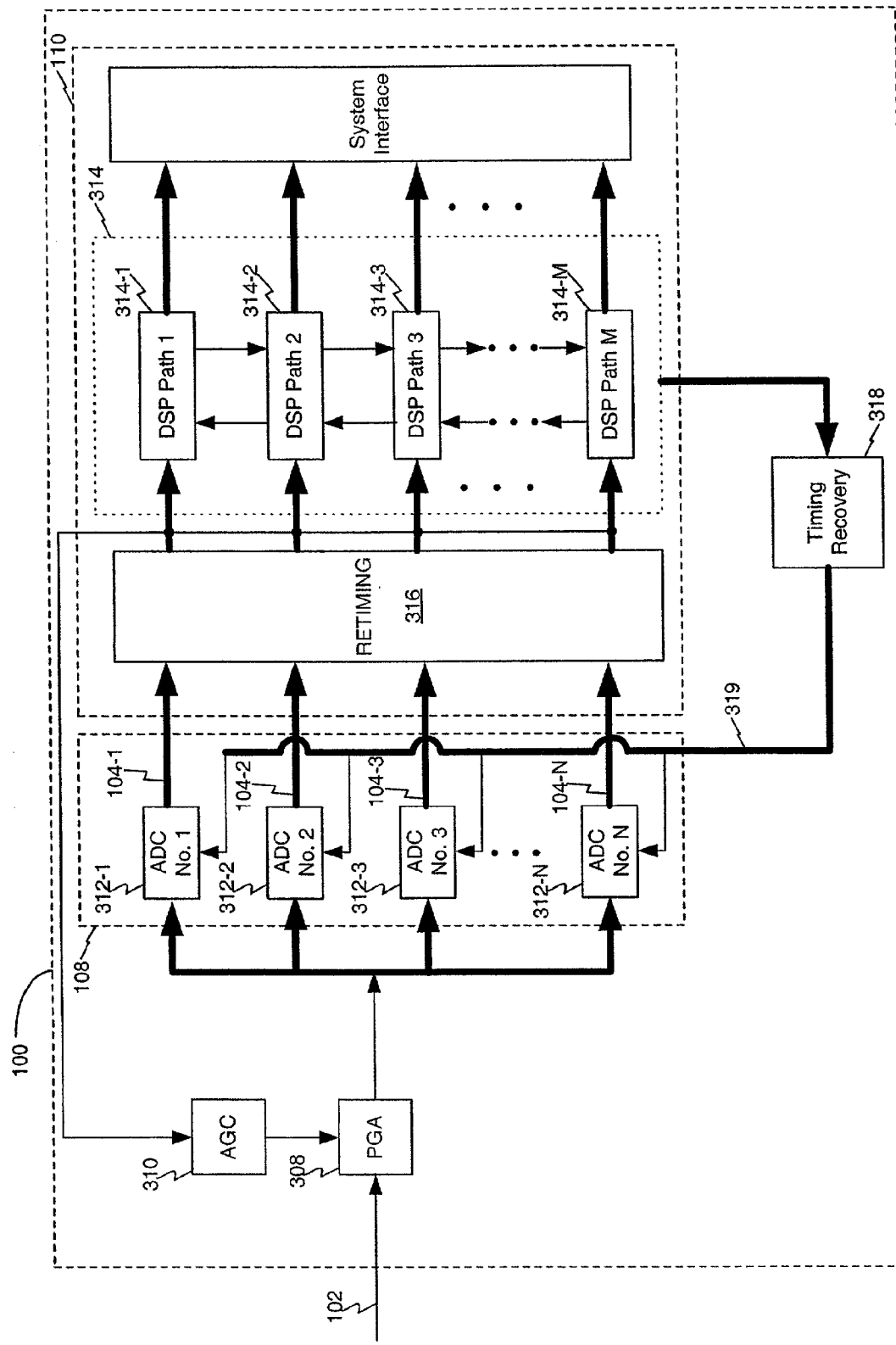
FIG. 3A is a block diagram of an example parallel receiver, including an N-path ADC and an M-path DSP, in accordance with an aspect of the invention.
Figure 3B:
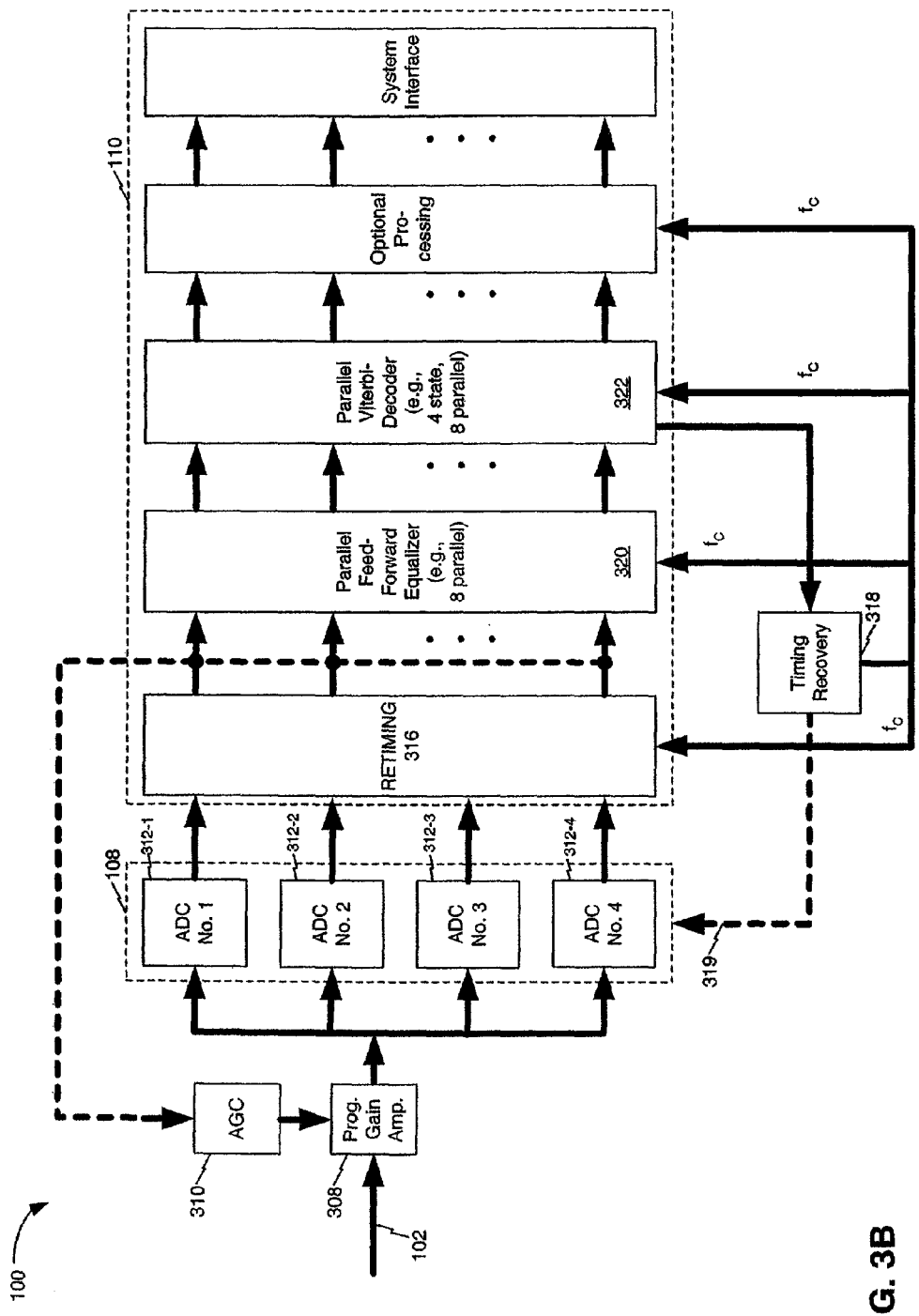
FIG. 3B is a more detailed block diagram of an example receiver in accordance with an aspect of the invention.

It is important not to confuse the concept of "multi-path receiver" with the concept of multiple receivers operating concurrently. In the context of this disclosure, "multi-path receiver" refers to a receiver where a single input data signal is digitized by an array of interleaved ADCs and/or processed by a digital signal processor using a parallel implementation, as shown in FIGS. 3A and 3B.

The examples herein are provided for illustrative purposes. The invention is not limited to these examples.

II. High Speed, DSP-Based Receiver

In accordance with an aspect of the invention, the receiver 100 is implemented as a high speed, or high data rate, DSP-based receiver that receives and digitally processes high data rate data signals 102. High data rate signals generally include data signals in the multi-giga bits per second range.

Generally, a high data rate receiver 100, having a high data rate ADC 108 and a high speed DSP 110, would require one or more high speed (e.g., gigahertz range) clocks. To facilitate implementation on a chip for high data rates, in accordance with an aspect of the invention, parallel processing is implemented wherein each parallel path operates at a lower clock rate.

A. Parallel ADC and DSP

FIG. 3A illustrates the receiver 100 implemented as a parallel receiver, wherein the ADC 108 is implemented as an array of N ADCs 312-1 through 312-N, and the DSP 110 is implemented with M parallel paths 314-1 through 314-M, where M=kN. The N ADCs 312-1 through 312-N and the M DSP paths 314-1 through 314-M operate at lower data rates than the received data signal 102. It is important to observe that the DSP paths need not be independent from one another. In other words, there could be cross-connections among the different DSP paths 314-1 through 314-M.

In an example embodiment, M=N=4 (i.e., k=1). Other embodiments use other values for N, M, and k. Motivations to use other values of k, for example k=2, include, without limitation, further reducing the clock speed to operate DSP blocks in the receiver. This can be the situation, for example, when implementing complicated algorithms requiring elaborate DSP architectures. In all the examples provided in this disclosure it is assumed that M is larger than or equal to N, therefore k is larger than or equal to one. However, it will be apparent to one skilled in the art that other embodiments where N is larger than M are also possible without departing from the spirit and scope of the present invention. This situation could arise, for example, if high-resolution ADCs were needed. In general there is a tradeoff between speed and resolution in the design of the ADC. Therefore in an application where high resolution ADCs are necessary, the speed of each path would be lower and the number of ADC paths required would increase. This could lead to a situation where N is larger than M. In this case it is generally not possible to compensate errors in all ADCs individually, but only in groups of N/M of them. Otherwise, the techniques disclosed herein can be applied equally well in this situation. However, for simplicity of description, the examples provided in this disclosure use M larger than or equal to N.

In FIG. 3A, the data signal 102 is received and digitized into a plurality of N parallel signals 104-1 through 104-N by the array of N lower speed ADCs 312-1 through 312-N. The ADCs 312-1 through 312-N can be single-bit ADCs or multi-bit ADCs. Each of the plurality of digitized parallel signals 104-1 through 104-N typically have a sampling rate lower than the symbol rate of the received data signal 102, but taken together, have a sampling rate substantially the same or higher than the symbol rate of the received data signal 102. In an embodiment, the received data signal 102 is a high data rate (e.g., gigabit(s) per second range) data signal. If the modulation scheme is binary (it encodes only one bit per symbol) the symbol rate is substantially equal to the data rate. The symbol rate can be reduced without reducing the data rate by using multilevel modulation schemes such as pulse amplitude modulation (PAM). For example, two bits per symbol could be transmitted by using a 4-level PAM modulation scheme (PAM-4). A binary modulation scheme is also known as PAM-2 (other common names are On-Off Keying (OOK) or binary antipodal signaling). In order to properly recover the data transmitted from the remote end, the receiver needs to take at least one sample per symbol of the received signal. These types of receivers are usually called "baud-rate-sampled receivers." However in some implementations the receiver could take more than one sample per symbol. These receivers are often called "oversampled receivers," or "fractionally-spaced receivers." Baud-rate-sampled receivers are usually more economical because, for the same symbol rate, they require lower speed ADCs than oversampled receivers. However, it will be apparent to one skilled in the art that the techniques disclosed in this invention can be applied equally well to baud rate sampled and/or oversampled receivers, as well as to receivers using a variety of modulation schemes, including, but not restricted to, PAM-2, multilevel PAM, single-carrier or multi-carrier quadrature amplitude modulation (QAM), etc.

A timing recovery module 318 performs timing recovery and provides one or more clock signals 319 to the ADC converter array 108. In an embodiment, the timing recovery module 318 operates the N lower speed ADCs 312-1 through 312-N in a staggered, or interleaved fashion. In other words, different phases of the clock signals 319 are provided to each of the ADCs 312-1 through 312-N. The different phases are staggered from one another so that each ADC 312-1 through 312-N samples a different portion or phase of the data signal 102. Interleaved samples 104-1 through 104-N from the ADCs 312-1 through 312-N are aligned by a retiming module 316.

Further signal processing is performed in the M-path DSP 110. Example operation of the DSP-based parallel receiver 100 illustrated in FIG. 3A is now described for a case where the data signal 102 is a 10 gigabit per second data signal and the ADC converter array 108 includes eight ADCs 312 (in other words, N=8 in this example), each operating at approximately 1250 MHz. The timing recovery module 318 outputs a 1250 MHz, eight-phase clock signal 319 on a bus, one phase for each of the ADCs 312-1 through 312-N. The eight-phase clock signal 319 operates the ADCs 312-1 through 312-N at 1250 MHz, separated in phase from one another by 45 degrees (i.e., 360 degrees/8 phases), in this example.

A parallel DSP-based receiver in accordance with the invention is useful for receiving high data rate signals. A high data rate DSP-based receiver in accordance with the invention is useful for lower data rate applications as well.

In an embodiment, the timing recovery module 318 includes an individual timing recovery loop for each of the ADC paths defined by the ADCs 312-1 through 312-N. Individual timing recovery loops are described below.

FIG. 3B illustrates an example implementation of the parallel DSP-based receiver 100 illustrated in FIG. 3A, wherein the ADC 108 is a 4-path ADC 108 and the DSP 110 is an 8-path DSP 10 (i.e., N=4, M=8, and k=2). The example 8-path DSP 110 includes an 8-path parallel FFE 320 and an 8-path parallel Viterbi decoder 322. Example implementations of parallel Viterbi decoders are described below. Additional example implementations of the M-path DSP 110 are provided below. The present invention is not, however, limited to these examples. Based on the description herein, one skilled in the relevant art(s) will understand that other N-path ADC and/or M-path DSP configurations are possible.

In FIG. 3B, the retiming module 316 provides samples of the retimed signals to the parallel feedforward equalizer 320, as well as to the timing recovery module 318 and to the AGC 310, as illustrated by the dotted lines.

In FIG. 3B the receiver 100 is illustrated with a programmable gain amplifier 308 and an automatic gain control 310. Implementation examples and operation of these components are described below.

In an embodiment, a parallel receiver in accordance with the invention is designed to receive a single data signal.

Alternatively, a parallel receiver in accordance with the invention is designed to receive multiple data signals. In such an embodiment, the receiver 100 is repeated for each data signal 102. Each repetition of a parallel multi-path DSP-based receiver is referred to herein as a slice, each slice having one or more parallel ADC and/or DSP paths.

Figure 4A:
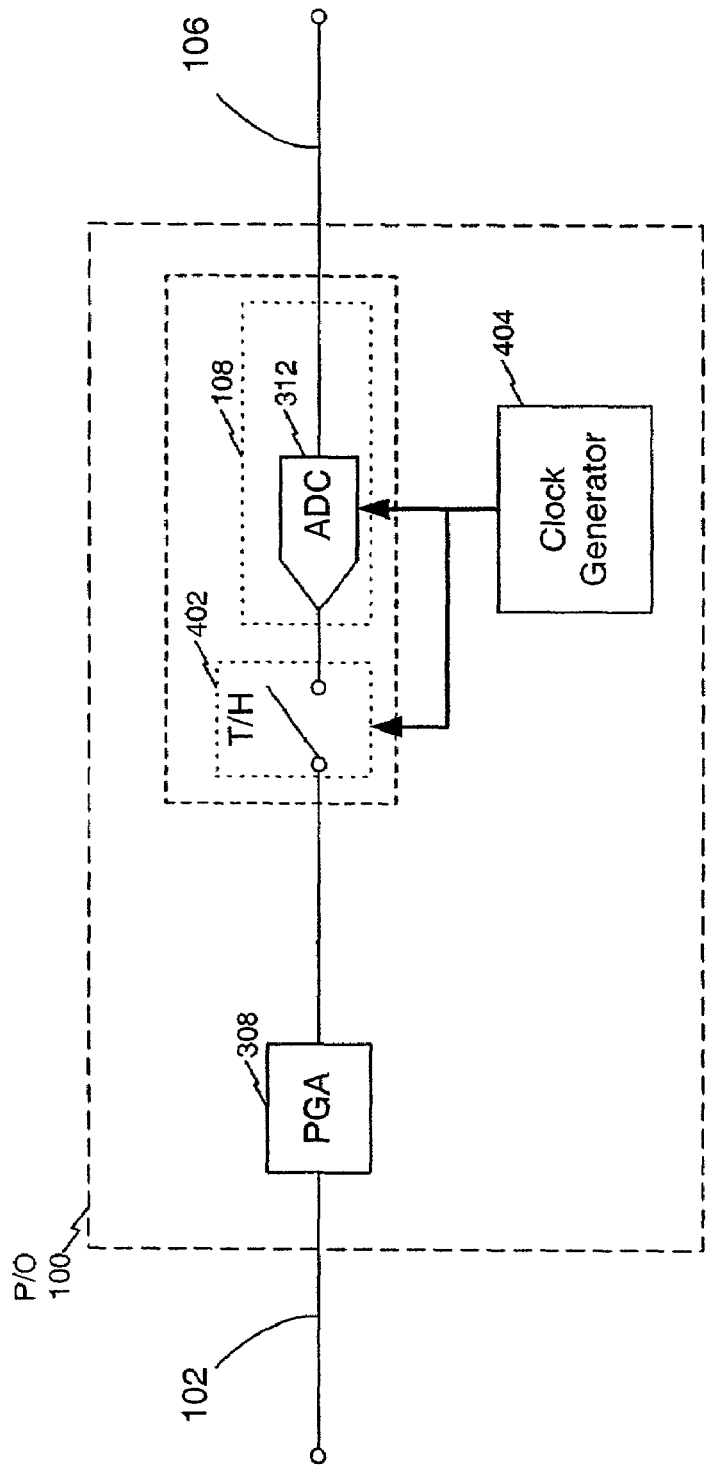
FIG. 4A is a block diagram of an example receiver that utilizes a track and hold device, in accordance with an aspect of the invention.

In an embodiment, the receiver 100 illustrated in FIG. 1, is implemented with one or more track and hold devices. For example, FIG. 4A illustrates a block diagram of a portion of an example receiver including a track-and-hold device 402 controlled by a clock generator 404. The track and hold device 402 provides a constant analog value to the ADC 108.

Figure 4B:
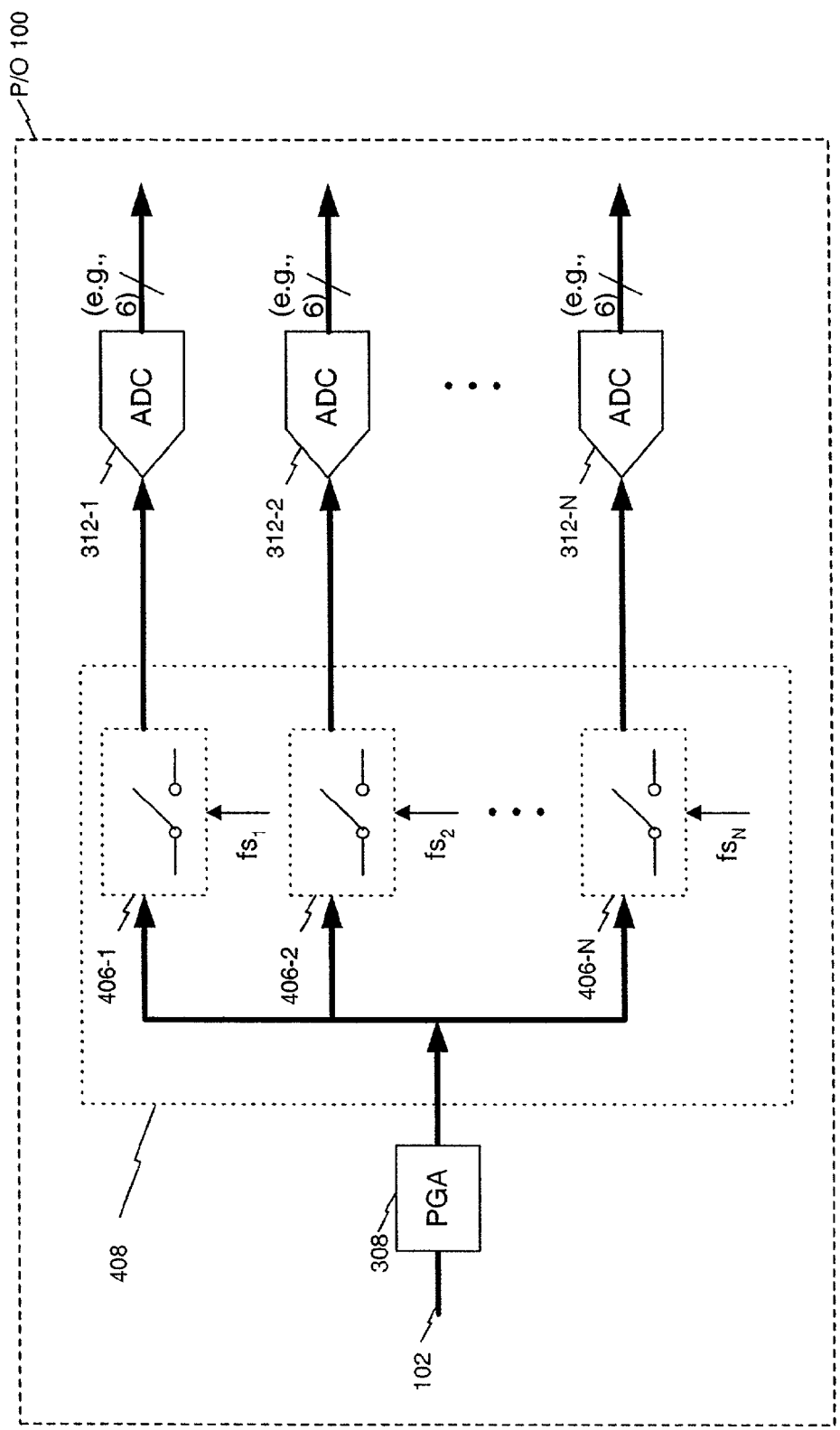
FIG. 4B is a block diagram of an example receiver that utilizes multiple track and hold devices in parallel, in accordance with an aspect of the invention.

In an embodiment, the multi-path receiver 100 illustrated in FIG. 1, is implemented with a plurality of track and hold devices. FIG. 4B illustrates a block diagram of a portion of an example parallel receiver including an array 408 of parallel track and hold devices 406-1 through 406-N.

III. Design and Control Considerations

In accordance with parallel multi-path receiver aspects of the invention, one or more of a variety of types of gain and/or phase errors and interleave path mismatches are detected and compensated for. Such errors and mismatches can be compensated for on a path-by-path basis and/or on a system wide basis. Compensation design and control considerations for parallel receivers are now described.

In accordance with the invention, one or more adaptive processes reduce error. Error is used in one or more feedback loops, for example, to generate equalizer coefficients, to optimize ADC sampling phase(s) for timing recovery, and/or to optimize gain for automatic gain control ("AGC"). Error correction can be used for other processes as well.

Error can be computed in one or more of a variety of ways. For example, error can be computed as a difference between input signals and decisions as to the values of the input signals. This is referred to herein as a decision-directed process. Decision-directed processes can be implemented with a slicer. Alternatively, decision-directed processes can be implemented with a Viterbi Decoder, as described below with respect to FIG. 8. Other decision-directed processes can be used as well. Other error determination processes can also be used.

Examples provided herein typically illustrate timing recovery, AGC, and offset cancellation algorithms as decision-directed processes, where error is computed at a slicer or equivalent decision device, such as Viterbi decoder. The examples are provided for illustrative purposes and are not limiting. Based on the teachings herein, one skilled in the relevant art(s) will understand that the techniques can be implemented with non-decision-directed processes as well, and/or in combinations of decision-directed and non-decision-directed processes.

A. Path-Based Timing Recovery and Phase Error Compensation

Referring to FIG. 3A, in an interleaved embodiment, the multi-phase sampling clock 319 provided by the clock recovery module 318 is generated by dividing down a higher frequency clock. Imperfections in the clock dividing circuitry, however, potentially lead to phase differences between the paths that depart from the intended value. This error has a systematic component and a random component.

Most of the random component typically originates in the random jitter of the high-frequency clock from which the N-phase sampling clock 319 is derived. Therefore the random error component tends to be approximately similar for the N interleaved ADCs.

The systematic component of the sampling phase error, however, tends to originate in a divider circuit, typically implemented within a timing recovery module, such as the timing recovery module 318 illustrated in FIG. 3A, and also in mismatches in the propagation delays of the clocks from the timing recovery module to the individual track-and-hold devices (as shown in FIG. 4B, there is a track-and-hold device 406-1 through 406-N in front of each ADC 312-1 through 312-N). Therefore, the sampling instants of the input signal experience a periodic jitter with a fundamental frequency fs, where fs is the frequency of the sampling clock driving each track and hold. When looking at the digital samples of the complete interleaved array, the effect of these systematic sampling phase errors is an error in amplitude of the digitized samples. This error is detrimental to the accuracy of the ADC converter array 108, and it can be a performance-limiting factor.

In accordance with an aspect of the invention, therefore, methods and systems are now described for reducing systematic jitter. The methods and systems are based on the M-parallel DSP paths described above, which makes it possible to separate the timing recovery module 318 into N loops, each loop responding to a phase error in a corresponding data path, which can then be compensated for in the corresponding N timing recovery loops.

Figure 3C:
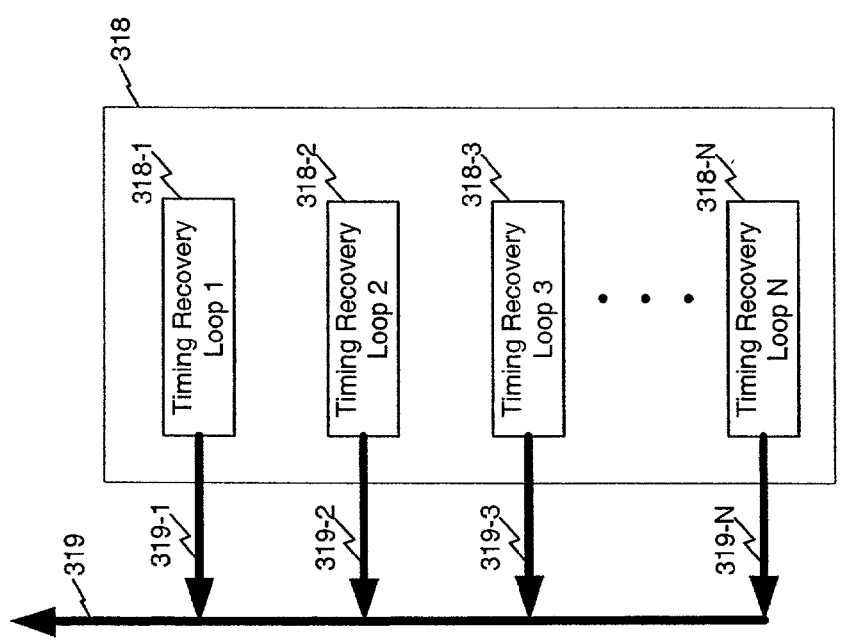
FIG. 3C is a block diagram of individual timing recovery loops that can be implemented for the N ADC paths illustrated in FIG. 3A or 3B.

FIG. 3C illustrates an example implementation of the timing recovery module 318 including multiple timing recovery loops 318-1 through 318-N. Example implementations of the multiple timing recovery loops 318-1 through 318-N are provided below.

An advantage of separate timing recovery loops is that the systematic phase errors introduced in the multi-phase sampling clock 319 by the frequency divider circuit can be independently compensated within the N independent timing recovery loops 318-1 through 318-N. This technique substantially reduces and/or eliminates the systematic component of the phase error in the interleaved ADC converter array 108, providing increased accuracy and ease of design. The systems and methods for compensating sampling phase errors described herein can be used in combination with one or more of a variety of timing recovery techniques.

1. Decision-Directed Timing Recovery

Figure 3D:
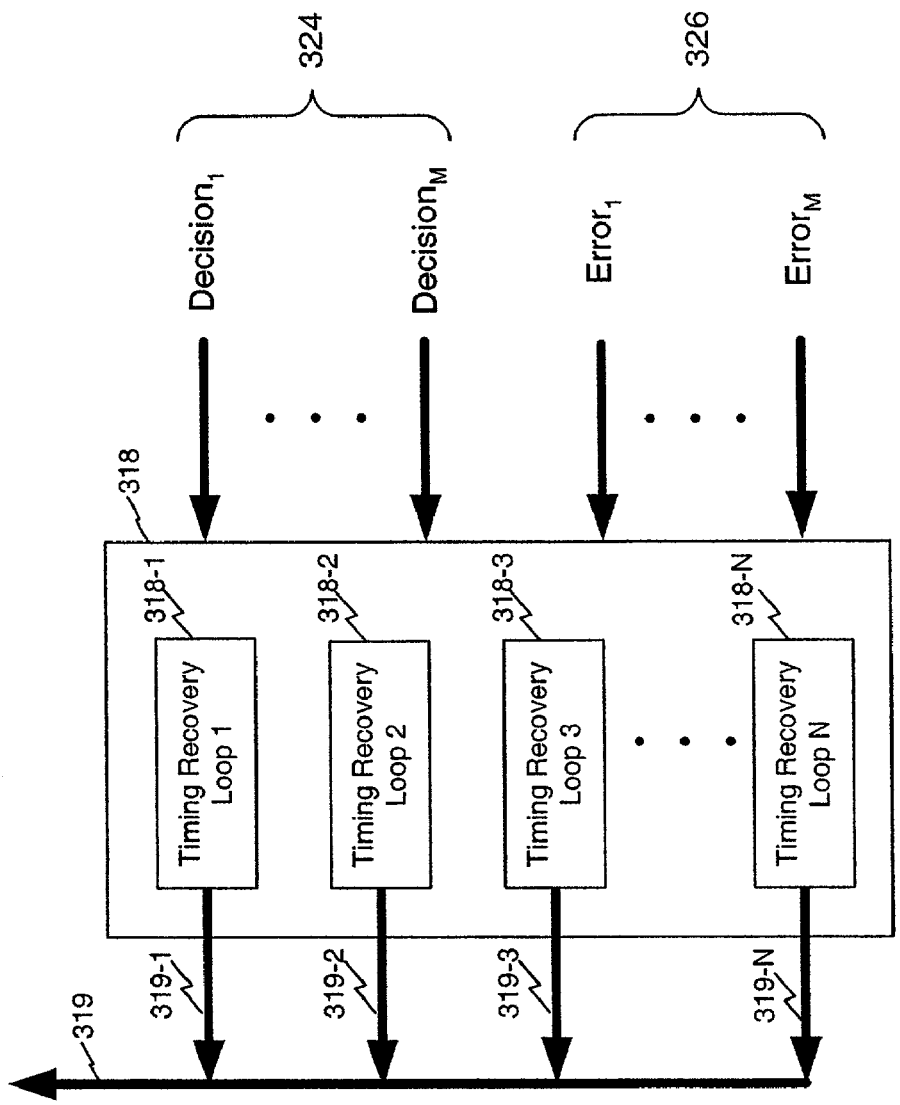
FIG. 3D illustrates an embodiment where the timing recovery module receives M decisions and M errors from the M DSP paths, in accordance with an aspect of the invention.

In an embodiment, the DSP-based receiver 100 utilizes one or more decision-directed timing recovery processes. For example, FIG. 3D illustrates an embodiment where the timing recovery module 318 receives M decisions 324 and M errors 326 from the M DSP paths. The significance and use of the decisions 324 and errors 326 are described below.

Figure 3E:
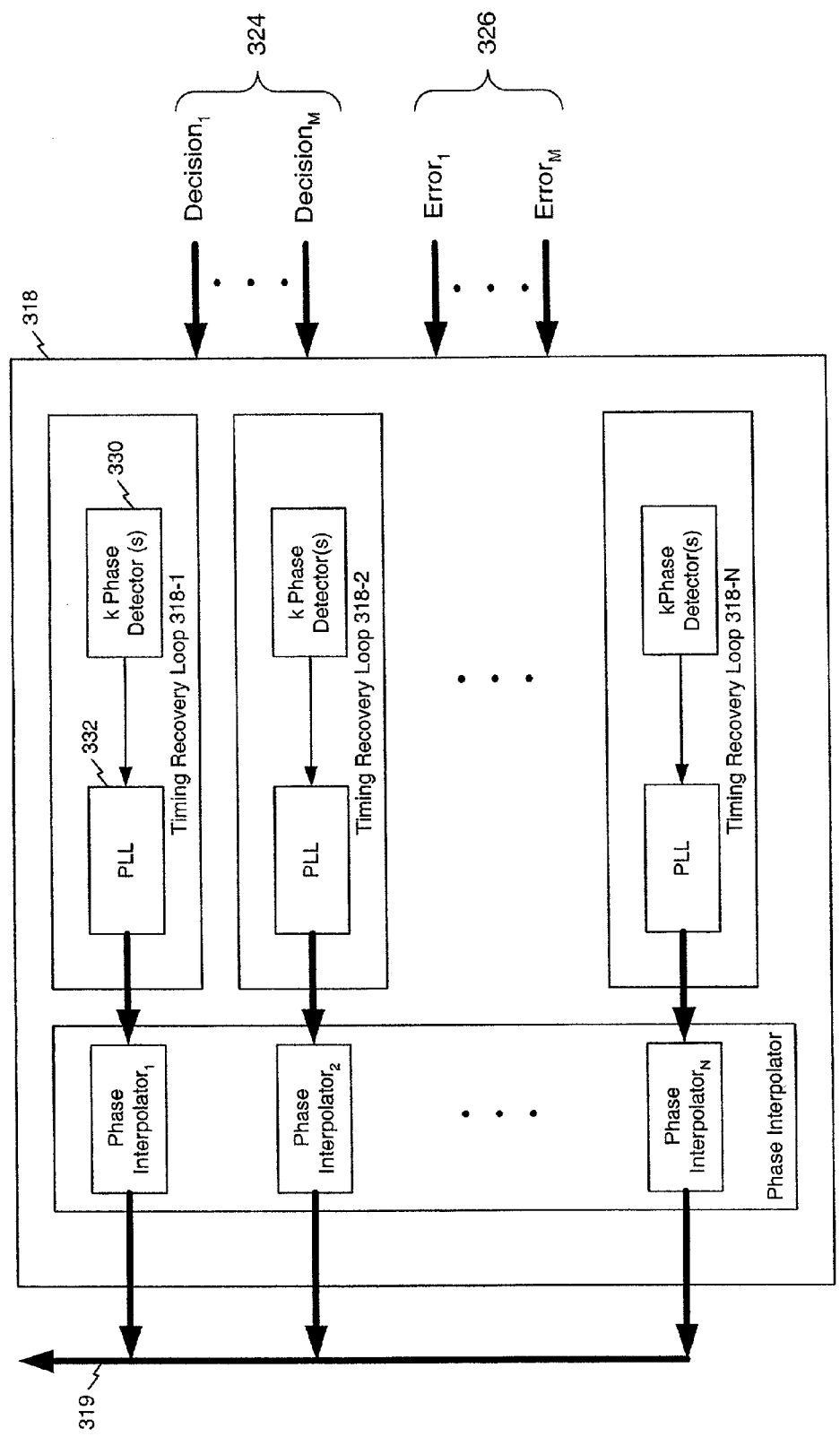
FIG. 3E illustrates an embodiment where each timing recovery loop includes a phase locked loop and k phase detectors, in accordance with an aspect of the invention.

FIG. 3E illustrates an embodiment where each timing recovery loop 318-1 through 318-N includes a phase locked loop (PLL) 332 and k phase detectors 330. Recall that k relates the number of ADC paths N to the number of DSP paths M, where M=kN. Example implementations of the phase locked loop 332 and k phase detectors 330 are described below with respect to FIG. 11.

Figure 3F:
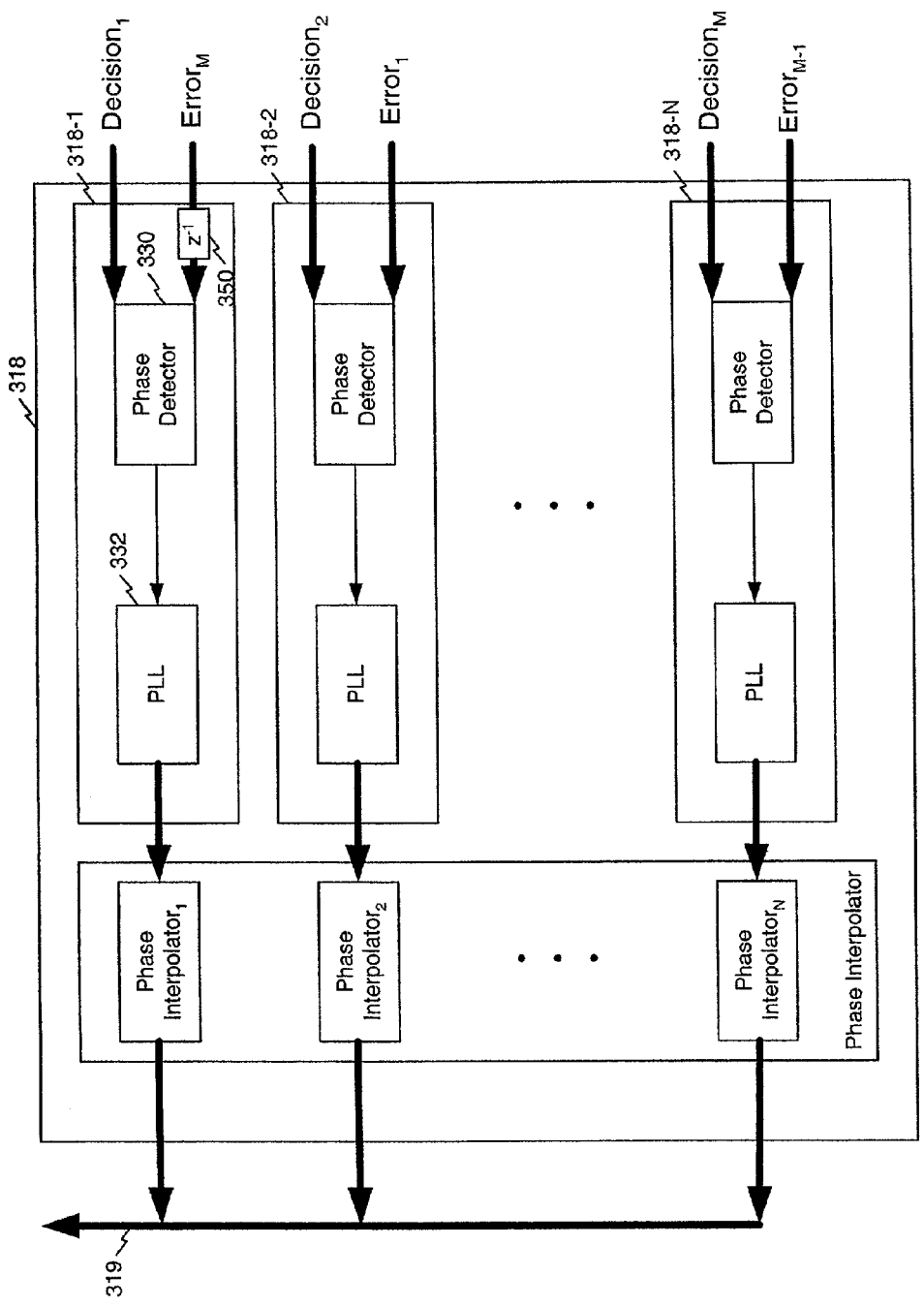
FIG. 3F illustrates an example embodiment where each timing recovery loop includes a phase locked loop and 1 phase detector, in accordance with an aspect of the invention. This is a special case where k=1.
Figure 3G:
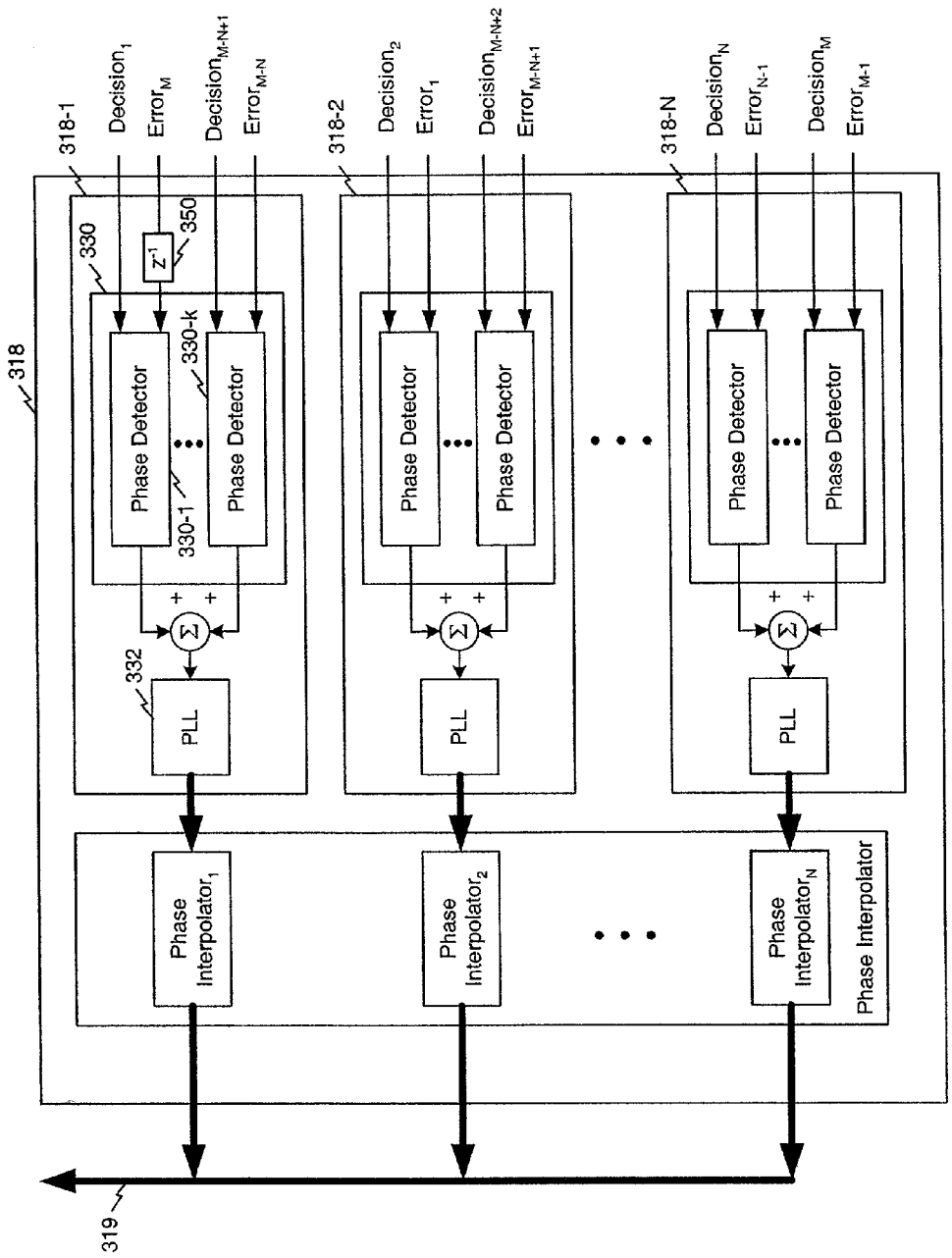
FIG. 3G illustrates an example embodiment where each timing recovery loop includes a phase locked loop and 2 phase detectors, (k=2), in accordance with an aspect of the invention.

The M decisions 324 and M errors 326 can be utilized by the timing recovery loops 318-1 through 318-N in a variety of ways, depending upon the number of ADC paths N and the number of DSP paths M. In other words, based upon the value of k. For example, FIG. 3F illustrates an example implementation for k=1. FIG. 3G illustrates an example implementation for other values of k. These example implementations are described below with respect to FIGS. 10 and 11.

Figure 3H:
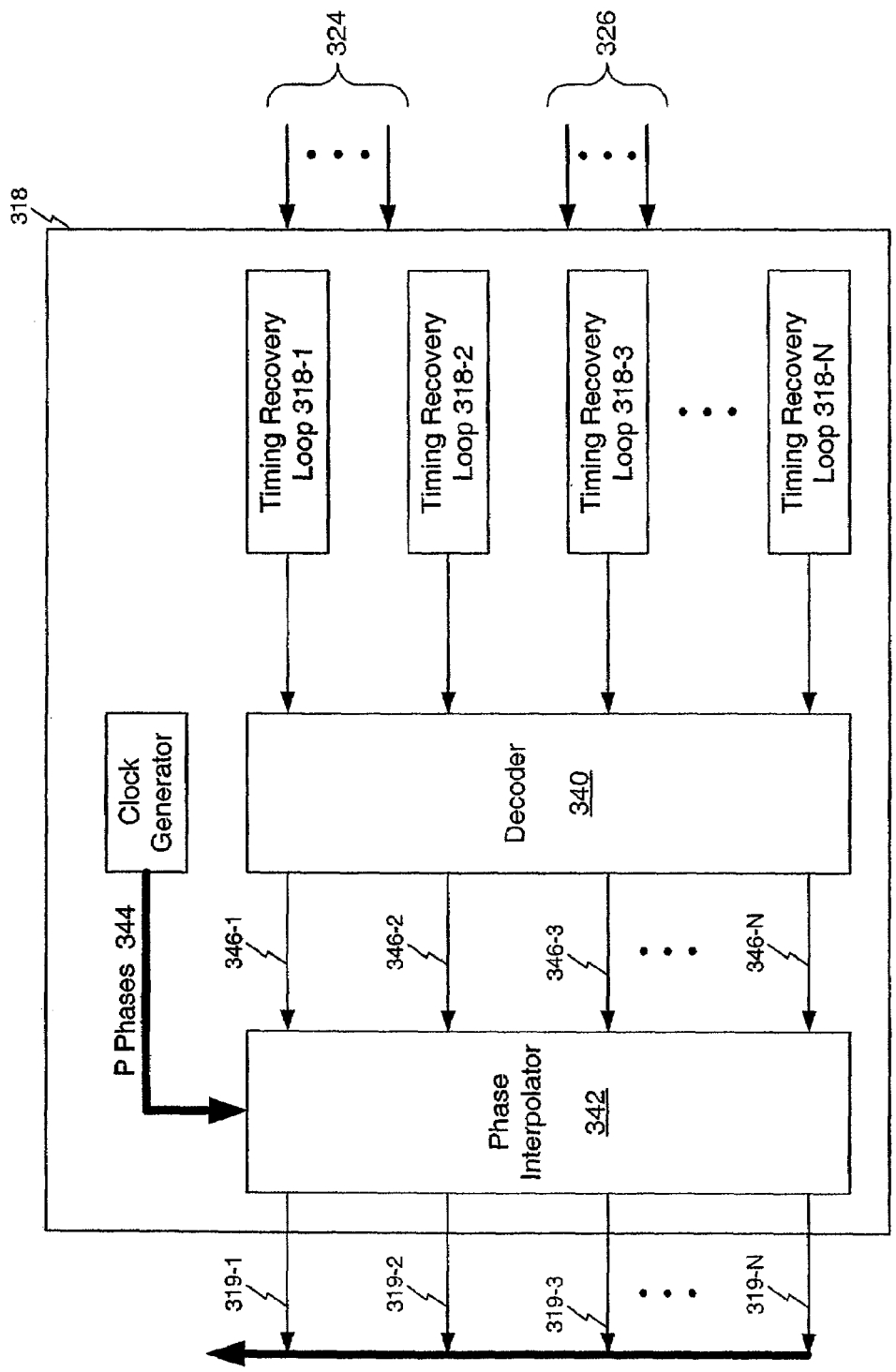
FIG. 3H illustrates an example implementation wherein the timing recovery module includes a decoder and a phase selector/phase interpolator, in accordance with an aspect of the invention.

FIG. 3H illustrates an example implementation wherein the timing recovery module 318 includes a decoder 340 and a phase selector/phase interpolator 342. The phase selector/phase interpolator 342 receives P phases 344-1 through 344-P, where P is an integer, from a clock generator. The phase selector/phase interpolator 342 also receives N phase interpolator control signals 346-1 through 346-N from the decoder 340. Alternatively, the phase selector/phase interpolator 342 receives the N phase interpolator control signals 346-1 through 346-N directly from the timing recovery loops 318-1 through 318-N.

The phase selector/phase interpolator 342 outputs N phases 319-1 through 319-N. P does not necessarily equal N. For example, in an embodiment, P=4 and N=8. In another embodiment, P=N=4. The invention is not, however, limited to these examples. Based on the description herein, one skilled in the relevant art(s) will understand that other values for N and P can be used. Example implementations of the phase selector/phase interpolator 342 are described below with respect to FIGS. 2 and 12.

Figure 10:
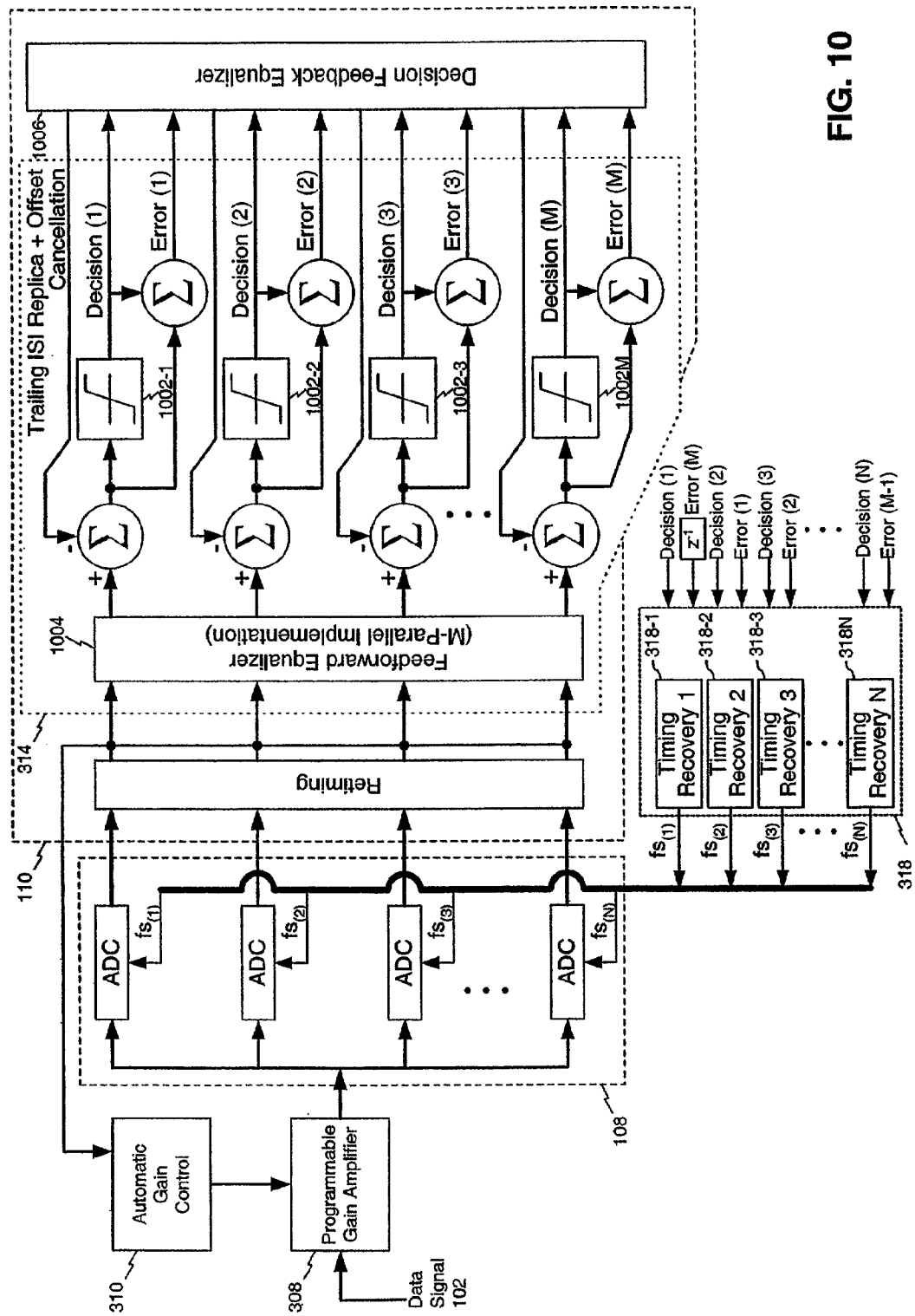
FIG. 10 is a block diagram of a parallel receiver with independent timing recovery loops for each parallel path, in accordance with an aspect of the invention.

FIG. 10 illustrates an example implementation of the timing recovery loops 318-1 through 318N wherein each timing recovery loop 318-1 through 318-N receives a decision from a corresponding DSP path and a sample of the slicer error from an adjacent DSP path. This configuration is described below with respect to FIG. 11. Each timing recovery loop 318-1 through 318N is designed to drive its associated path phase error towards zero.

In the embodiment of FIG. 10, the M-path DSP 110 includes an FTE 1004, a DFE 1006, and slicers 1002-1 through 1002-M. Decisions and slicer error signals are shown as being taken from slicers 1002-1 through 1002-M. Phase error signals are computed by the timing recovery modules 318-1 through 318N, based on the decisions and the slicer errors, as shown in more detail in FIG. 11. This corresponds to an exemplary decision-directed timing recovery algorithm. However, other timing recovery algorithms can be utilized.

In the example of FIG. 10, decisions are generated from slicers 1002, and errors are generated as a difference between the slicer decisions and the input to the slicers 1002. Alternatively, decisions and errors are generated with a Viterbi decoder and channel estimator. For example, in FIG. 8B, a Viterbi decoder 804 receives an input signal 810 through a feed-forward equalizer 812, and outputs decisions 806, which can be final decisions or tentative decisions. Tentative decisions can be provided by the Viterbi decoder 804 with less delay than final decisions, while final decisions tend to be more accurate than tentative decisions. The choice between tentative decisions and final decisions is generally a trade-off between latency and accuracy. The choice can be influenced by the quality of the input signal 810. The decisions 806 are provided to a channel estimator 808, the output of which is subtracted from the input signal 810. The resulting error is analogous to the slicer error described above.

Figure 11:
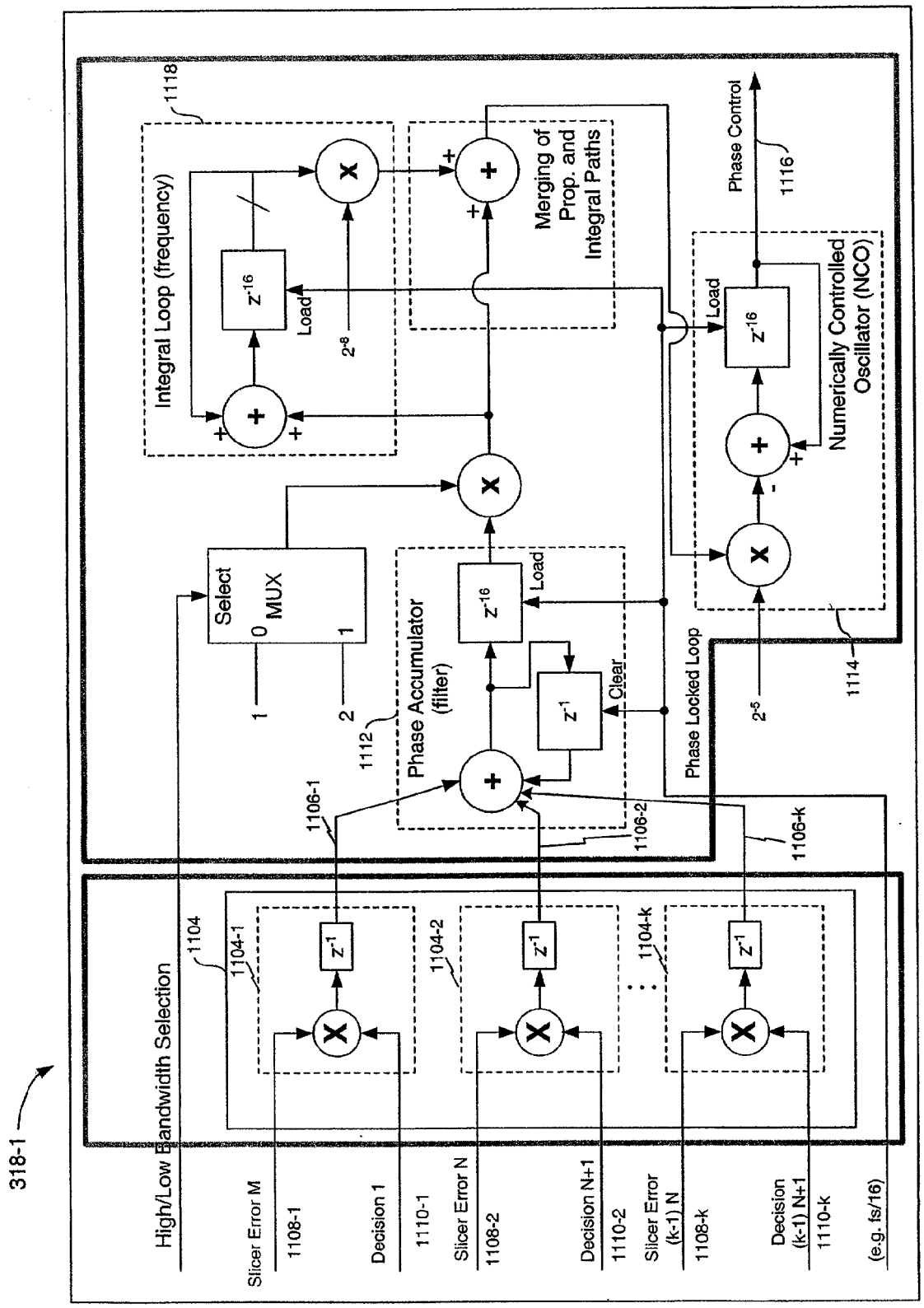
FIG. 11 is a block diagram of an example timing recovery block in accordance with an aspect of the invention.

FIG. 11 is a block diagram of an example implementation of the timing recovery loop 318-1 illustrated in FIGS. 3C–3H and FIG. 10. Timing recovery loops 318-2 through 318-N are similarly configured. In FIG. 11, the timing recovery loop 318-1 includes k phase detectors 1104-1 through 1104-k, which generate k phase error signals 1106-1 through 1106-k. Each phase error signal 1106-1 through 1106-k is generated by cross-correlating a decision 1110 for a given path with a slicer error 1108 corresponding to an adjacent path, as illustrated in FIGS. 3F and 3G, for example The phase error signals 1106-1 through 1106-k are computed in the exemplary embodiment of FIG. 11, by, for example, using a variety of the well-known Mueller and Muller algorithms. See, for example, K. H. Mueller and M. Muller, "Timing Recovery in Digital Synchronous Data Receivers," IEEE Transactions on Communications COM-24, pp. 516–531, May 1976, incorporated herein by reference in its entirety, where the phase error is based on the precursor of the channel impulse response at the output of the FFE, with the precursor taken one symbol period before the sample on which the decision is based. In this algorithm, the phase error is computed with the slicer error delayed by one symbol period. In a serial implementation this is achieved, for example, by introducing a pipeline register clocked at the symbol rate in the error path going to the phase detector. In a parallel-processing implementation, the one symbol delay of the error is achieved by, for example, taking the error sample from an adjacent path, as shown in FIG. 10. In other words, the decision 1110 comes from the same path where phase is being controlled, but the error 1108 comes from the adjacent path corresponding to the samples of the input signal taken one baud period earlier. Because of the parallel architecture of the DSP, these samples appear at the same cycle of the DSP clock, but on an adjacent path.

A delay 350 is inserted in the error 1108-1 because the error M 1108-1 comes from a preceding block relative to the decision 1110-1. The delay 350 is substantially equal to M cycles of the input or baud clock, or one cycle of the DSP clock. For example, where the data signal 102 is a 10 Gbit/sec signal, and where M equals 4 (i.e., 4 DSP paths), the delay 350 is set to ¼ of 10 Gbits/sec., or approximately 400 picoseconds.

The phase error signals 1106-1 through 1106-k are filtered by an accumulate and dump filter 1112 and further filtered by an integral filter 1118. The sum of the proportional and integral paths is used to control a numerically controlled oscillator ("NCO") 1114. Therefore, the phase locked loop illustrated by FIG. 11 is a second-order (or proportional plus integral) loop. Digital control words 1116 generated by the NCO 1114 are used to control a phase selector (not shown in FIG. 11).

2. Phase Selector

Figure 2:
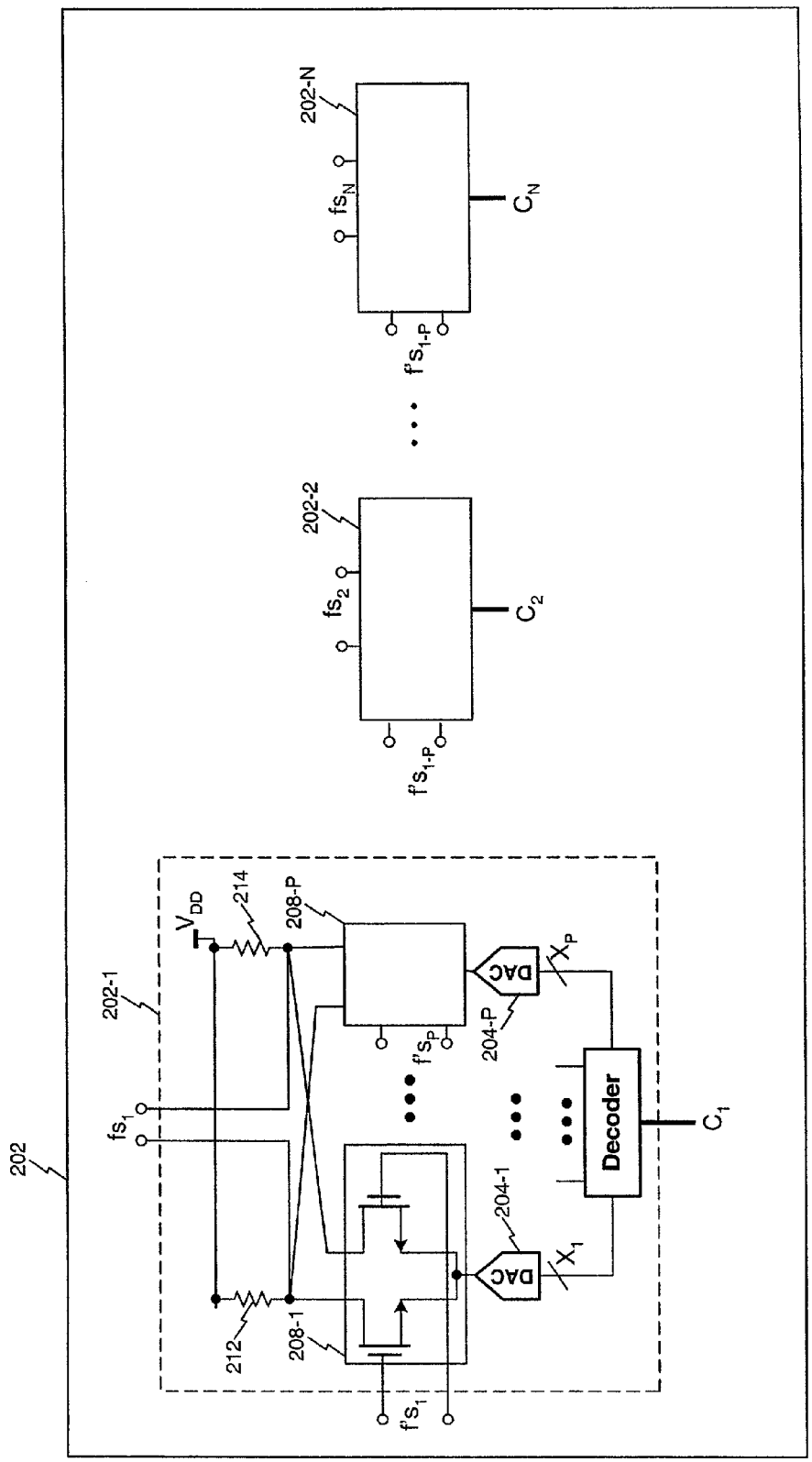
FIG. 2 illustrates an example analog phase interpolator that can be implemented with the digital timing recovery system illustrated in FIG. 10, in accordance with an aspect of the invention.
Figure 12:
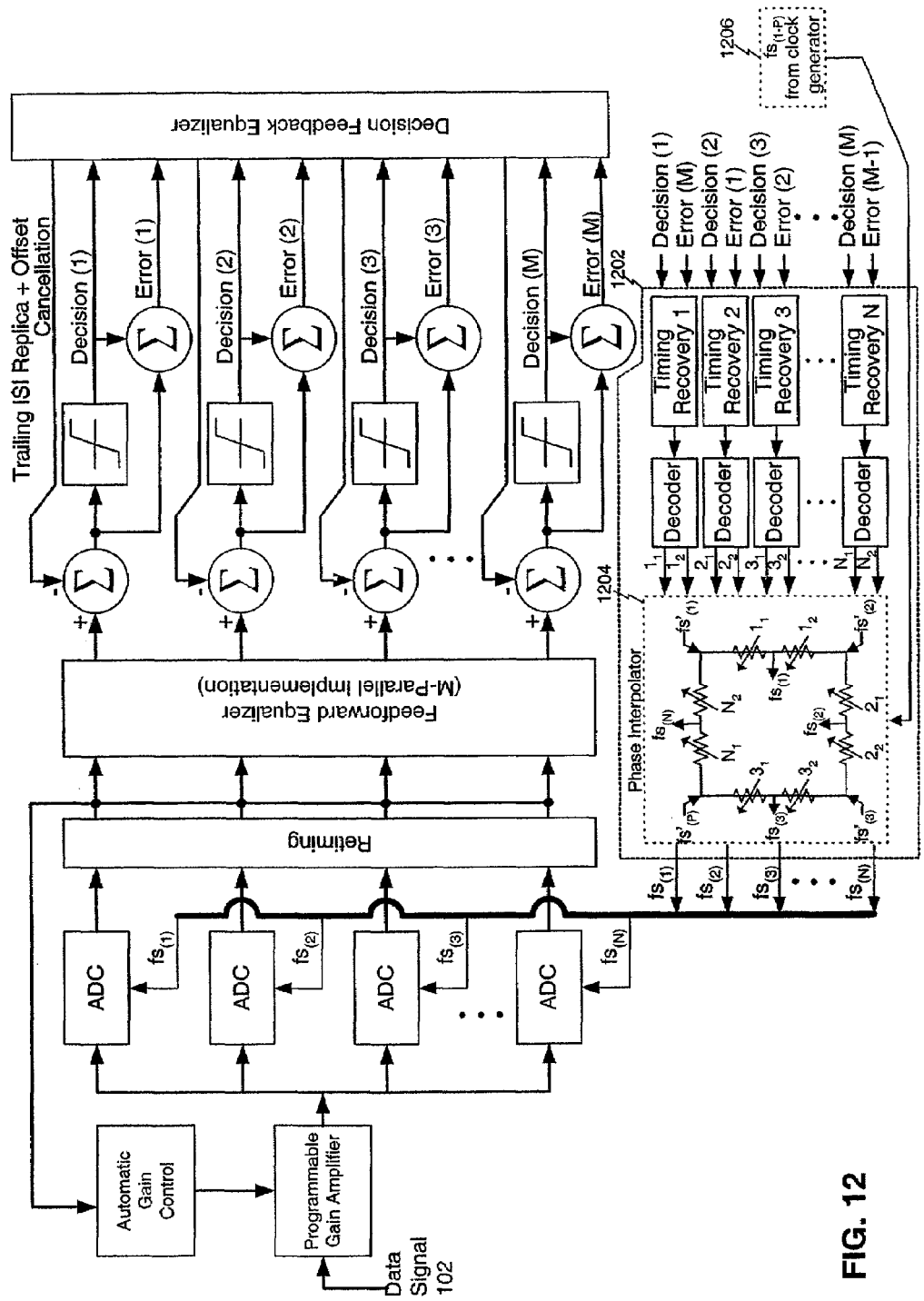
FIG. 12 illustrates an example analog phase interpolator that can be implemented with the digital timing recovery system illustrated in FIG. 10, in accordance with an aspect of the invention.

In an embodiment, phase compensation is performed with a phase interpolator or phase selector. In an embodiment, the phase selector digitally generates multi-phase sampling clocks by, for example, taking a weighted sum of multiple (e.g., 4), phases with finite rise and fall times. FIGS. 2 and 12 illustrate example phase selectors in accordance with aspects of the invention. The example phase selector in FIG. 2 generally provides faster response times. Alternatively, a conventional phase selector is utilized. The present invention is not, however, limited to digitally controlled phase selectors.

a. DAC-Based Phase Selector

FIG. 2 illustrates an example phase selector 202 in accordance with an aspect of the invention. The phase selector 202 shown in FIG. 2 exemplifies a situation where the number of output phases $fs_1$ through $fs_N$ may be different from the number of input phases $f's_1$ through $f's_P$. The number of output phases $fs_1$ through $fs_N$ is always N, the same as the number of ADC paths. However the number P of input phases $f's_1$ through $f's_P$ could be smaller than N. In an embodiment, N is a multiple of P.

The phase selector 202 includes N interpolator sub-blocks 202-1 through 202-N, that receive digital control words $C_1$ through $C_N$, respectively. The digital control words $C_1$ through $C_N$, correspond to the phase interpolator control signals 346-1 through 346-N described above with respect to FIG. 3H.

In FIG. 2, phase interpolator sub-block 202-1 is illustrated in detail, operation of which is now described. The digital control word $C_1$ is applied through a decoder to current-mode digital-to-analog converters ("DACs") 204-1 through 204-P, which control the bias current of respective differential pairs 208-1 through 208-P. The inputs to the differential pairs 208-1 through 208-P are taken from consecutive input phases. The drain currents of the differential pairs 208-1 through 208-P are combined in output resistors 212 and 214, which generate the output phase $fs_1$. The output phase $fs_1$ is thus a weighted sum of $fs_1$ through $fs_p$, wherein the weighting is determined by the DACs 204-1 through 204-P, under control of the control signal $C_1$.

There are N phase interpolator sub-blocks 202-1 through 202-N, each one corresponding to an output phase. The number of input phases P is typically smaller than the number of output phases, N. It must be noted that, although the circuit shown in FIG. 2 uses particular components such as NMOS transistors and resistors, there are many alternative implementations, including, but not limited to, FET or BJT circuits in other integrated circuit technologies such as silicon germanium, indium phosphide, gallium arsenide, etc. The essential aspect of this phase selector 202 is the use of digitally controlled weighted sums of two input phases to generate an output phase. This concept can be implemented in many alternative ways without departing from the spirit and scope of the present invention, as will be apparent to one skilled in the art.

b. Resistive Interpolation Ring

In an embodiment, multi-phase sampling clocks 319 are generated by a resistive phase interpolator. FIG. 12 illustrates an example timing recovery block 1202 implementation, which is an example embodiment of the timing recovery block 318 illustrated in FIG. 10. The timing recovery block 1202 includes a resistive interpolation ring phase selector 1204. Input phases $fs_{1-N}$ 1206 from a clock generator are provided to the resistive interpolation ring phase selector 1204. In an embodiment, the input phases $fs_{1-N}$ 1206 are derived from a divider operating on an independent clock. When the frequency of operation of the divided down clock is relatively high, the clock edges tend to have finite rise and fall times that are comparable to the period of the waveform. The number of input phases P need not be the same as the number of ADC paths N. This is explained more clearly in connection with FIG. 2.

By interpolating between two such waveforms of phase difference corresponding to a quarter of a period, new waveforms, $fs_{1-N}$, with phase differences corresponding to fractions of, for example, a quarter of a period from the original signals $fs_{1-N}$ 1206 are obtained. In an embodiment, the phase difference is electrically controlled by changing the relative interpolation factors by, for example, changing the values of the interpolation resistors in a digital fashion, driven by, for example, the timing recovery circuit.

The example phase selector implementations described herein are provided for illustrative purposes. The present invention is not limited to these examples. Based on the teachings herein, one skilled in the relevant art(s) will understand that other phase selector methods and systems can be utilized.

B. Gain and Offset Mismatch Compensation

In accordance with an aspect of the invention, methods and systems are provided for reducing gain errors, offsets, and/or undesired sampling clock phase differences among the paths defined by the ADCs 312-1 through 312-N (FIG. 3A).

1. DSP-Based Adaptive Path Gain and Offset Mismatch Control

In accordance with an aspect of the invention, gain and offset mismatches between paths are compensated for in a DSP, wherein gain factors adapt for individual paths.

Figure 5:
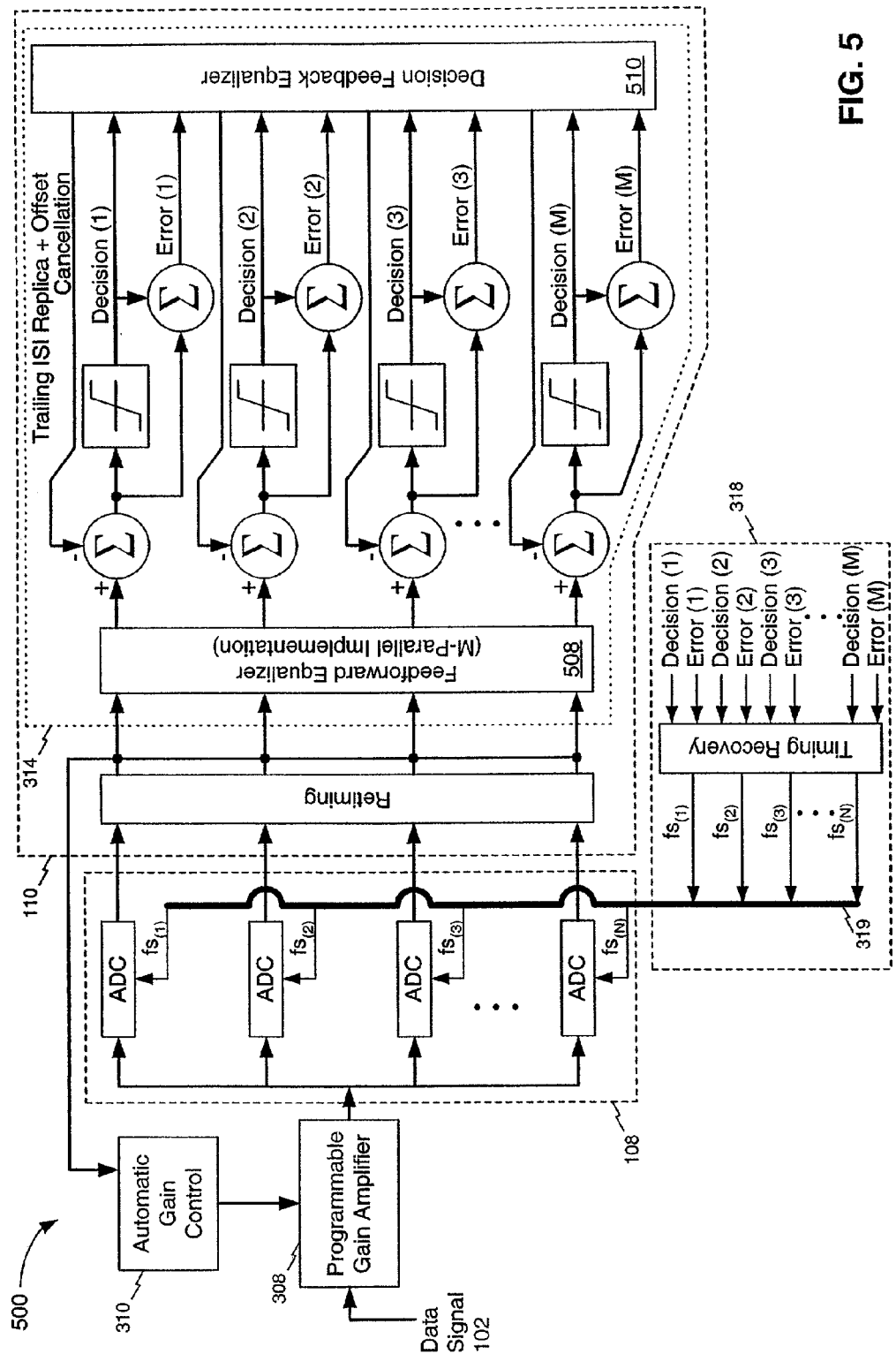
FIG. 5 illustrates an example parallel receiver that utilizes, among other things, DFE-based offset cancellation on a per path basis, in accordance with an aspect of the invention.

FIG. 5 illustrates an example DSP-based parallel receiver 500, which is an example implementation of the receiver 100 illustrated in FIG. 3A. The receiver 500 utilizes DFE-based offset cancellation on a per path basis, in accordance with an aspect of the invention. Under this approach, offsets originating in the ADC 108 or anywhere in the analog front end are individually controlled for each ADC path by an equalizer adaptation algorithm to compensate the offsets in the digital domain independently for each path. In the embodiment of FIG. 5, a single Programmable Gain Amplifier 308 with global gain control is shown. As will be discussed later, independent gain control for each ADC path can also be implemented in the digital domain using, for example, Feed-forward Equalizer. FIE-based digital control can be omitted where, for example, the gain errors of the ADC paths can be accurately controlled by design, thus requiring little or no digital gain mismatch compensation. In a more common situation, relatively significant gain mismatches exist among the ADC paths, therefore digital compensation of gain mismatches is preferred. A scheme where gain mismatches in the ADC paths are individually compensated in the analog domain will be discussed later in connection with FIG. 7. Alternatively, gain mismatches can be digitally compensated using the Feed-forward Equalizer. FIG. 5 also shows the independent phase error compensation technique already discussed in connection with FIGS. 10, 11, and 12. It will be apparent to one skilled in the art that the sampling phase error, gain error, and offset compensation techniques disclosed herein can be used independently of each other and in any combination required, depending on the need for compensation of the different errors that circuit design and/or manufacturing tolerance considerations motivate in each specific situation.

In FIG. 5, the M-path DSP 110 includes an M-path parallel FEE 508, M individual decision and error paths, and an M-path DFE 510. In an embodiment, the number of parallel ADC paths N equals the number of parallel DSP paths M. The invention is not, however, limited to this embodiment.

Figure 8A:
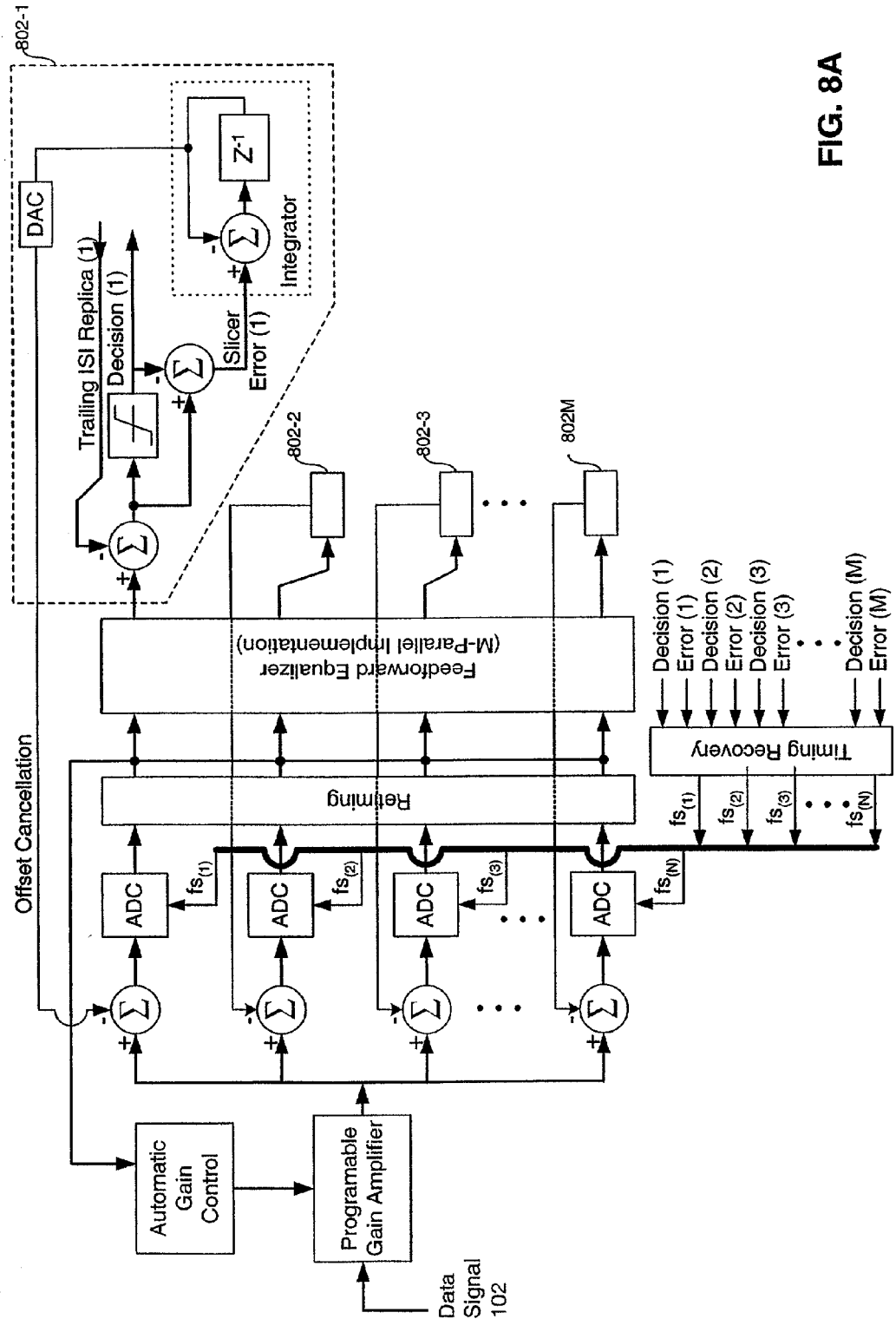
FIG. 8A illustrates an example implementation for offset mismatch compensation in accordance with an aspect of the present invention.
Figure 8B:
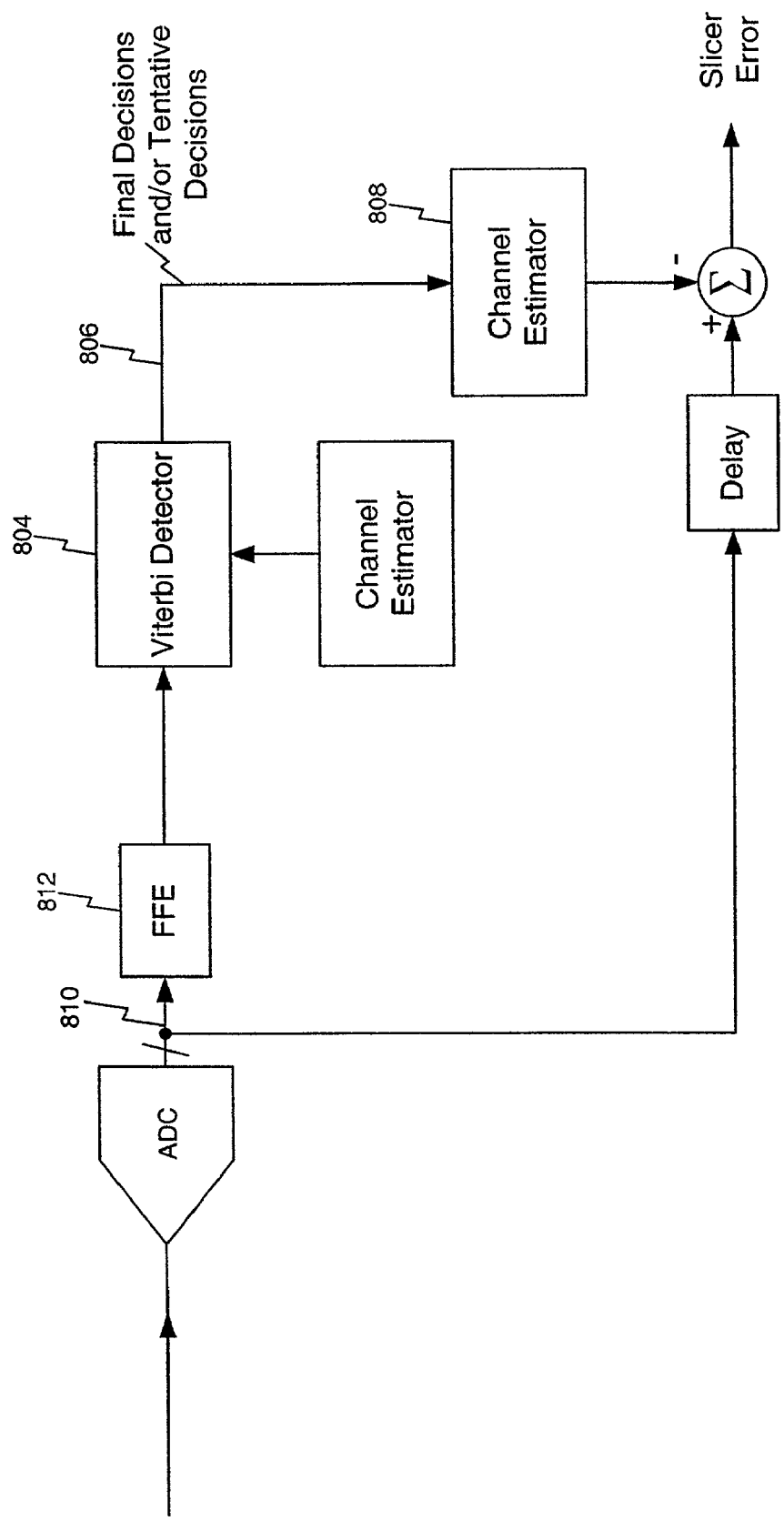
FIG. 8B illustrates an example Viterbi decoder-based decision-directed error signal generator, in accordance with an aspect of the invention.

The example parallel receiver 500 shows an implementation of a DEE and offset cancellation scheme that can not only compensate for offset, but can also compensate for offset mismatches among the interleaved array of ADC paths. In an embodiment, the offset cancellation scheme is implemented with one or more DC taps per ADC path in the DFE 510. This approach is described in more detail in FIG. 9, where the DC taps are implemented by the integrators inside blocks 902-1 through 902-M. FIG. 8 also uses DC taps in the DFE to compensate for offsets independently for each ADC path, but in this case compensation is done in the analog domain. Since each interleave uses an independent, and independently adapted, DC tap, offsets that do not necessarily match across the interleaved paths can be compensated.

In FIG. 5, the timing recovery module 318 receives decisions and errors from the M individual decision and error paths in the DSP 110, and adjusts the phases of the sampling clocks 319-1 through 319-N accordingly.

In the receiver 500, gain factors are individually controlled for each path after the ADC array 108. Overall dynamic range of the ADC converter array 108 is optionally controlled by the AGC module 310 and the PGA module 308. This helps to optimize use of all of the bits of the ADC array 108.

Figure 6:
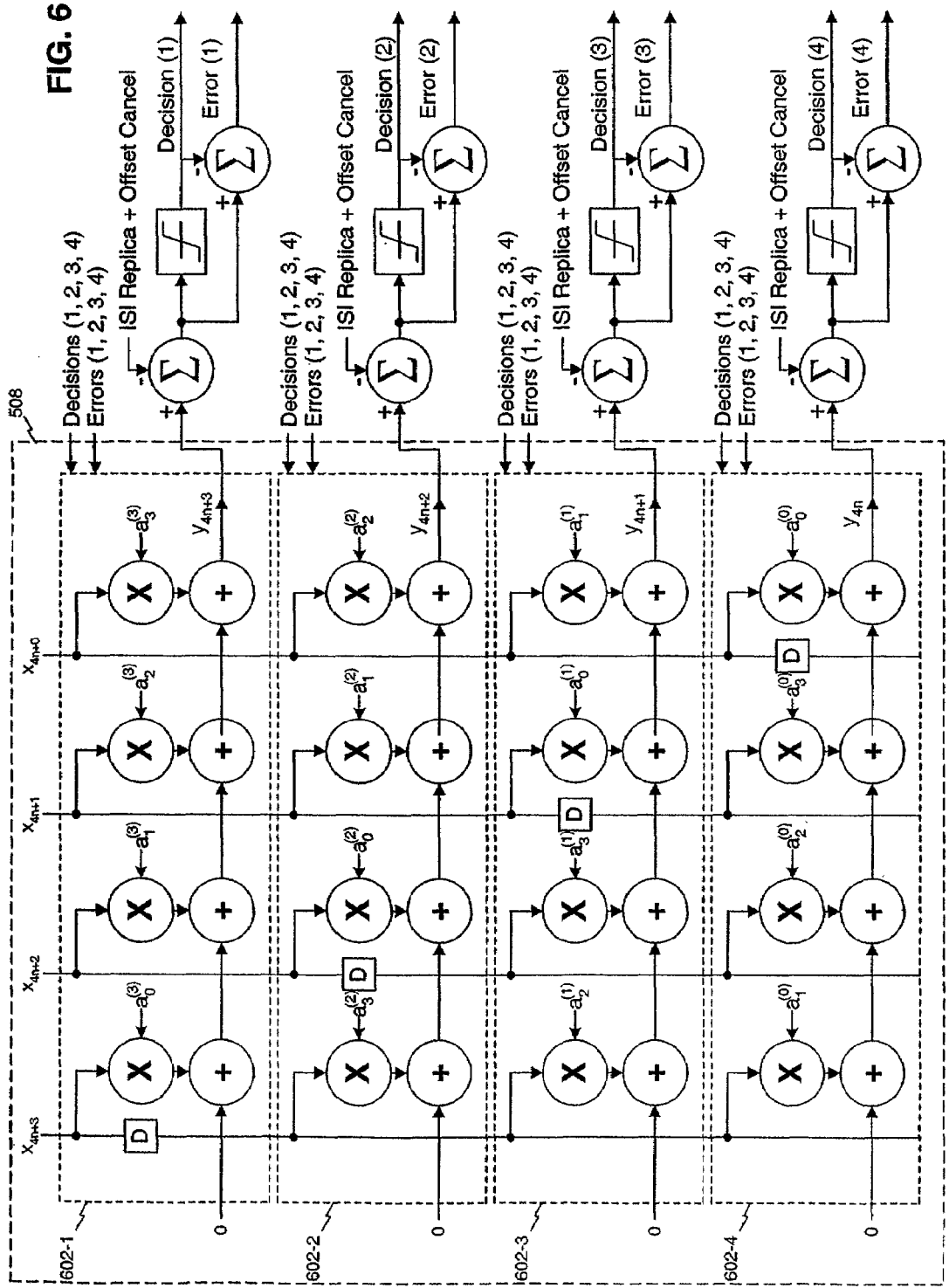
FIG. 6 illustrates example implementation details of the equalizer illustrated in FIG. 5, in accordance with an aspect of the present invention.

FIG. 6 illustrates an example of a 4-tap adaptive FFE 508 implemented as a 4-parallel array having paths 602-1 through 602-4. The number of taps and the degree of parallelization can be varied as desired. In the example implementation of FIG. 6, the parallel paths 602-1 through 602-4 are essentially four adaptive transversal filters.

For an ideal channel (i.e., a channel where there are no gain mismatches in the paths), it would be economical to share the coefficients of the filters in the paths 602-1 through 602-4. In other words, it would be economical to make $a_r^{(0)}=a_r^{(1)}=a_r^{(2)}=a_r^{(3)}$ (r=0, . . . , 3) in FIG. 6. In practice, however, gain mismatches typically occur. By making the coefficients independent of one another, and adapting them independently, the coefficients of the M-paths will individually converge to potentially different values to compensate for gain errors of the lower frequency ADC s 312-1 through 312-N.

In addition to reducing gain mismatches in the paths, independent adaptation of the gain coefficients tends to reduce bandwidth mismatches in the paths, which otherwise could cause impulse responses of the paths to differ from one another.

The FFE can also act as an interpolation filter. Having independent coefficients for the different parallel sections, as explained before, means that the FFE can also compensate for sampling phase errors in the ADCs. This is particularly true when the input signal is bandlimited to half the baud rate or less. This provides an alternative way to compensate for sampling phase errors, as well as gain errors in the ADCs of an interleaved array.

2. Automatic Gain Control (AGC)

Figure 7:
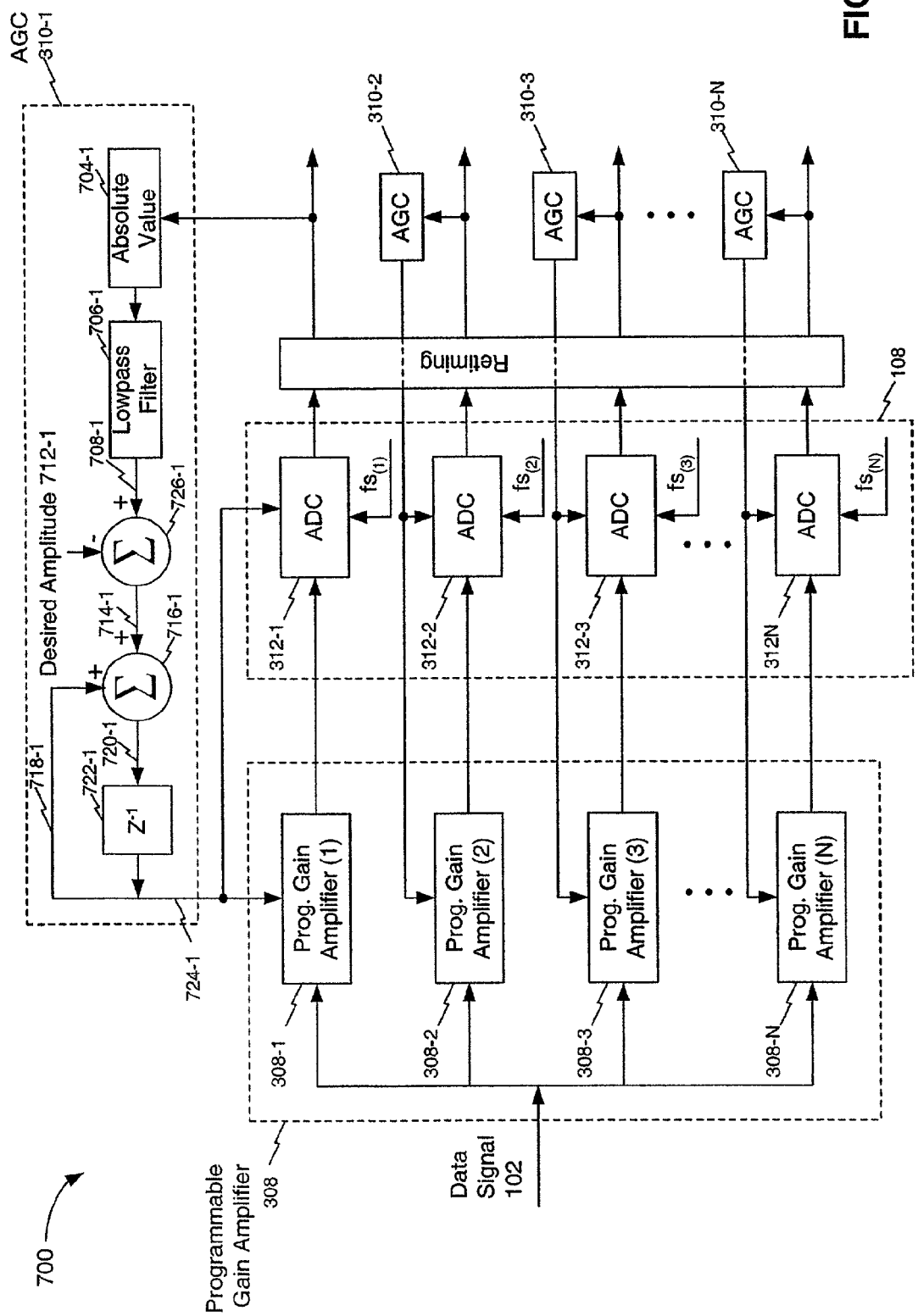
FIG. 7 illustrates an example programmable gain amplifier and an example automatic gain control module, in accordance with an aspect of the present invention.

In accordance with an aspect of the invention, gain errors in the interleaved ADC paths are compensated for on a path by path basis, using path-specific AGCs, wherein gain factors adapt for individual paths. FIG. 7 illustrates an example path-specific AGC implementation, which can be utilized to reduce gain errors in the interleaved paths. The example path specific AGC implementation illustrated in FIG. 7 can be implemented in place of the FFE-based gain error compensation scheme illustrated in FIGS. 5 and 6. It can also be combined with offset compensation schemes like the ones discussed in connection with FIGS. 5 and 8.

FIG. 7 illustrates an implementation of a portion 700 of the receiver 100 illustrated in FIG. 3A, in accordance with an aspect of the invention. The portion 700 includes a plurality of path-specific AGCs 310-1 through 310-N, which control a PGA array of path-specific PGAs 308-1 through 308-N.

Path-specific AGCs 310-1 through 310-N are now described with reference to path-specific AGC 310-1. Path-specific AGCs 310-2 through 310-N are configured similarly. Path-specific AGC 310-1 includes an absolute value module 704-1 and a lowpass filter 706-1, which provides a measured amplitude 708-1 to a differencer 726-1. The differencer 726-1 subtracts a desired amplitude 712-1 from the measured amplitude 708-1 and outputs a difference value 714-1 to an adder 716-1. The adder 716-1 together with the accumulator 722-1 constitute a digital integrator. The integrator integrates the difference value 714-1 and outputs a PGA control value 724-1 to PGA 308-1. PGA control value 724-1, or a portion thereof, is optionally provided to ADC 312-1 to adjust a reference voltage therein. Path-specific AGCs 310-2 through 310-N operate in a similar fashion.

In the example of FIG. 7, gain errors are obtained or generated in the digital domain, and used to control the independent PGAs 308-1 through 308-N. Since the gain error is measured in the digital domain, any gain errors introduced by the lower frequency ADCs 312-1 through 312-N will be driven to approximately zero by the AGC circuitry.

The present invention is not, however, limited to this example. Based on the description herein, one skilled in the relevant art(s) will understand that automatic gain control can be implemented in other ways. For example, and without limitation, where gain mismatches of the interleaved ADC paths are relatively negligible, automatic gain control can be shared by all of the ADC paths, wherein the PGAs 308-1 through 308-N share a common control signal.

3. Analog Compensation

FIG. 8 illustrates an example implementation for gain and offset mismatch compensation, where offset associated with each ADC 312-1 through 312-N in the interleaved ADC array 108 is substantially cancelled in the analog domain. Analog cancellation can be utilized in place of, or in addition to digital cancellation. Offsets introduced by each of the lower frequency ADCs 312-1 through 312-N are preferably measured in the digital domain. Alternatively, offsets introduced by each of the lower frequency ADCs 312-1 through 312-N are measured in the analog domain.

In a similar way, the gain errors can be compensated for by controlling the reference voltage of the ADCs. In this case, the PGA can be shared across all the interleaves.

4. Alternative Implementations

Figure 9:
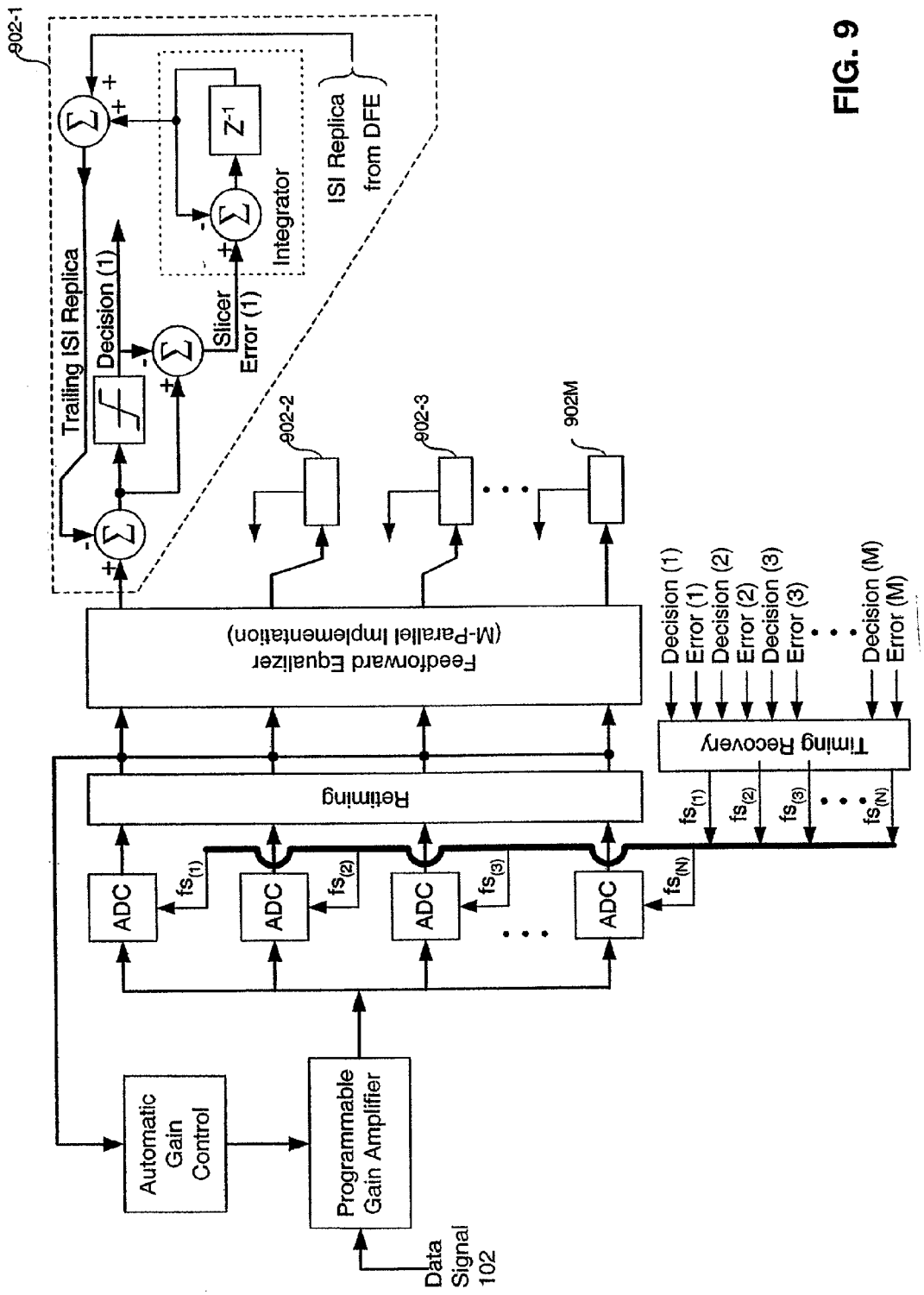
FIG. 9 illustrates another example implementation for offset mismatch compensation, in accordance with an aspect of the present invention.

FIG. 9 illustrates an exemplary receiver implementation that compensates offset mismatches. The exemplary implementation can be further modified to compensate gain errors between the ADC paths as well. Based on the description herein, one skilled in the relevant art(s) will understand that the exemplary implementation illustrated in FIG. 9 can be modified in a variety of ways to compensate for gain errors.

IV. Parallel Equalization

In accordance with an aspect of the present invention, one or more types of equalization are performed in a parallel multi-path receiver.

A. Parallelization of a Viterbi Decoder

In an embodiment of the present invention, Viterbi equalization is performed in a multi-path receiver.

Parallel Viterbi decoders are described in, for example, Fettweis and Meyr, "Parallel Viterbi Algorithm Implementation: Breaking the ACS-Bottleneck," *IEEE Transaction On Communications*, Vol. 37, No. 8, August 1989, and Fettweis and Meyr, "High-Rate Viterbi Processor: A Systolic Array Solution," *IEEE Transaction On Communications*, Vol. 37, No. 9, August 1990, both of which are incorporated herein by reference in their entireties.

In accordance with an aspect of the invention, Viterbi decoders are parallelized by the DSP parallelization factor M. This allows the Viterbi process to be run at a clock rate of $f_B/M$, where $f_B$ is the symbol rate of the receiver. For example, for $f_B$=3.125 GHz, and M=8, the Viterbi processor would run at a clock rate of 390.625 MHz. The invention is not, however, limited to this example.

For a given number of decoder states S, the amount of hardware needed for the parallel implementation generally grows linearly with the degree of parallelization M. This allows large parallelization factors M to be implemented, and makes implementation of Viterbi decoders feasible at relatively high symbol rates.

Parallelization is based on the idea of defining an M-step trellis (also with S states), which represents the state transitions after M symbol periods. Branch metrics for the M-step trellis can be computed using S "rooted trellises." Computation of the rooted trellises can be parallelized.

Figure 13:
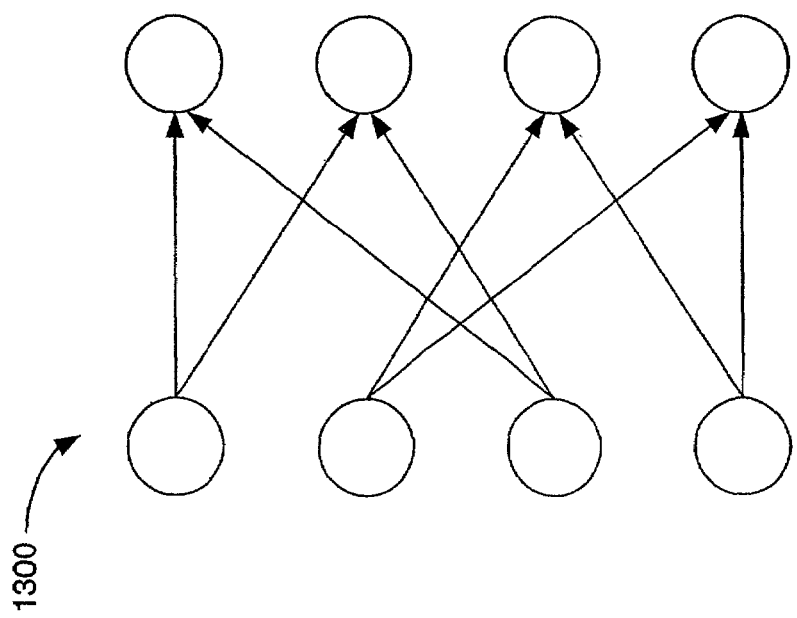
FIG. 13 illustrates an example 4-state, 1-step trellis that runs at a clock rate substantially equal to the symbol rate, in accordance with an aspect of the present invention.
Figure 15A:
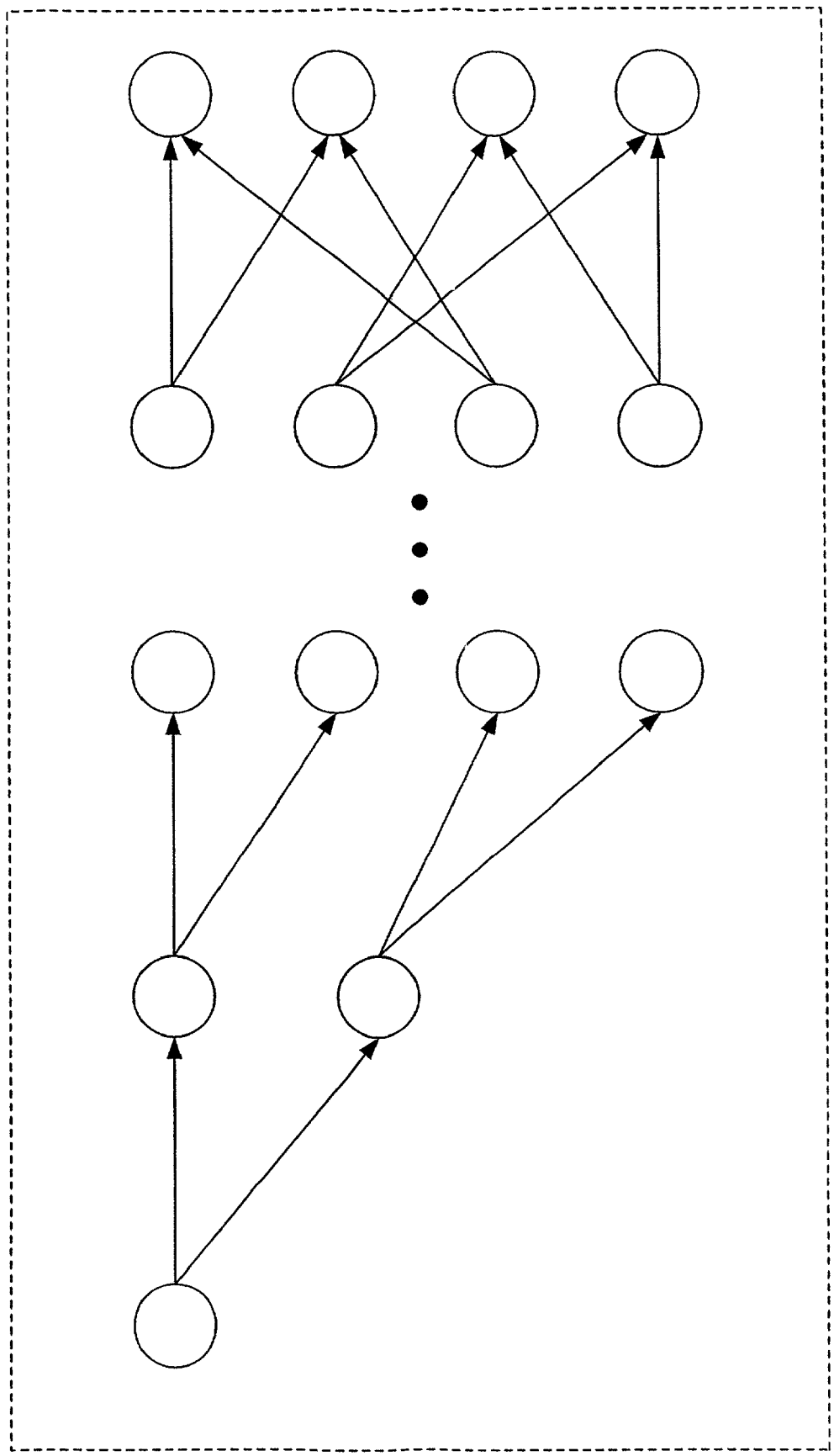
FIG. 15A illustrates an example rooted trellis, in accordance with an aspect of the present invention.
Figure 15B:
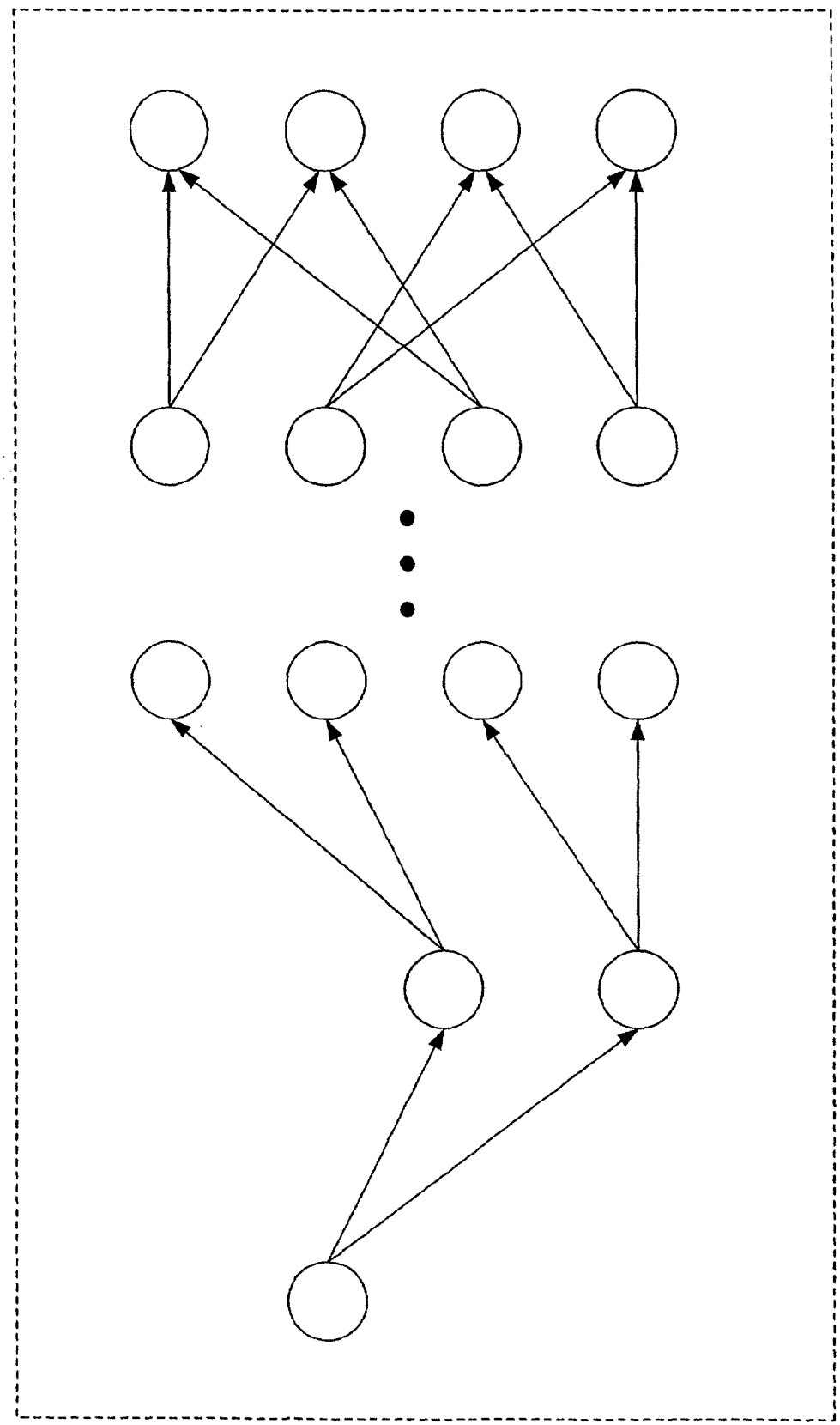
FIG. 15B illustrates another example rooted trellis, in accordance with an aspect of the present invention.
Figure 15C:
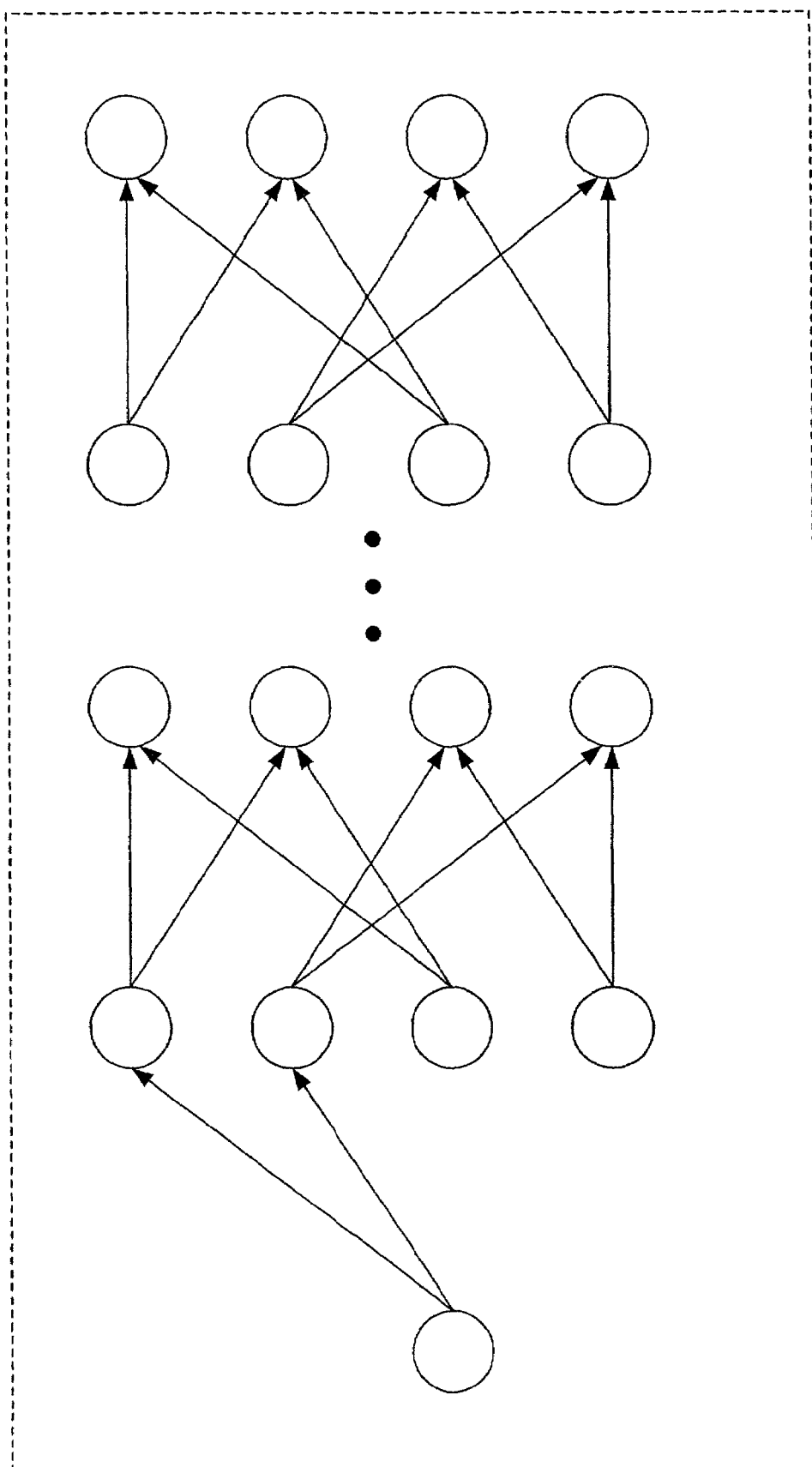
FIG. 15C illustrates another example rooted trellis, in accordance with an aspect of the present invention.
Figure 15D:
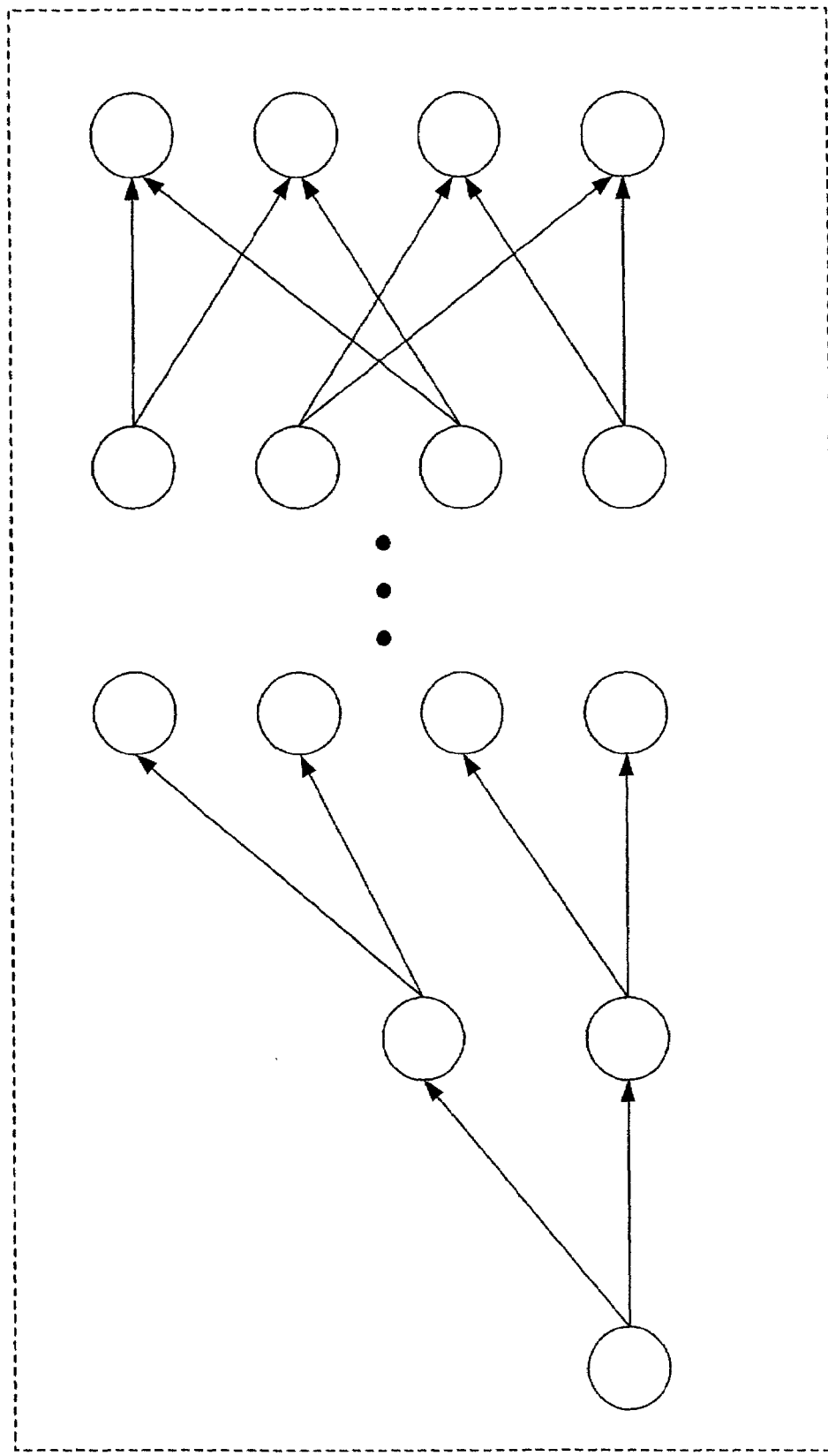
FIG. 15D illustrates another example rooted trellis, in accordance with an aspect of the present invention.

FIG. 13 illustrates an example 4-state, 1-step trellis 1300 that runs at a clock rate substantially equal to the symbol rate, in accordance with an aspect of the present invention.

Figure 14:
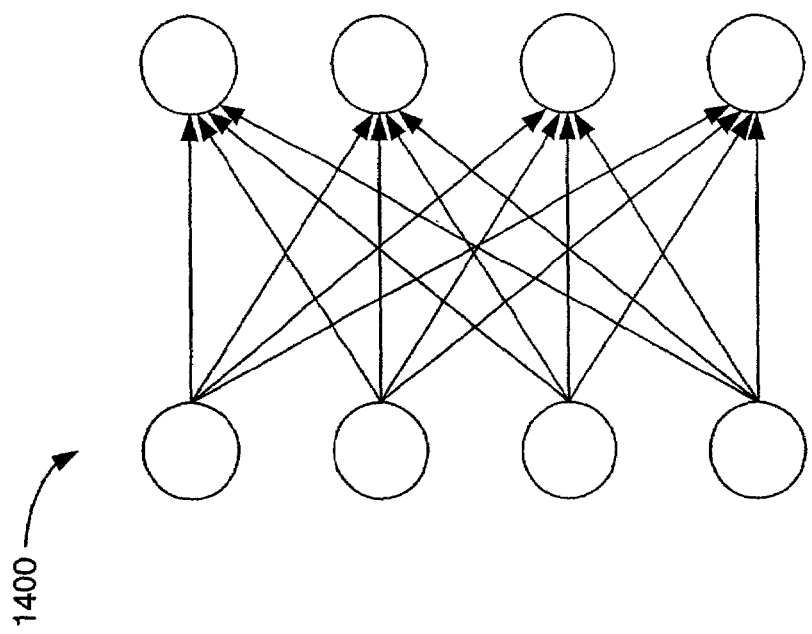
FIG. 14 illustrates an example 4-state, M-step trellis that runs at a clock rate substantially equal to $1/M^{th}$ of the symbol rate, in accordance with an aspect of the present invention.

FIG. 14 illustrates an example 4-state, M-step trellis 1400 that runs at a clock rate substantially equal to $1/M^{th}$ of the symbol rate, in accordance with an aspect of the present invention.

FIGS. 15A through 15D illustrate example rooted trellises, in accordance with aspects of the present invention.

FIG. 16 illustrates an example systolic implementation of rooted trellis computation, in accordance with an aspect the present invention.

FIG. 17 is a high level block diagram of an example parallel Viterbi processor in accordance with an aspect the present invention.

V. Error Correction

In an embodiment, the invention includes error correction processing.

This processing can be done by the Viterbi decoder or elsewhere. Error correction processing includes, but is not limited to, hard-decision decoding or soft-decision decoding of convolutional, trellis, or block codes.

VI. Methods of Operation

Figure 18:
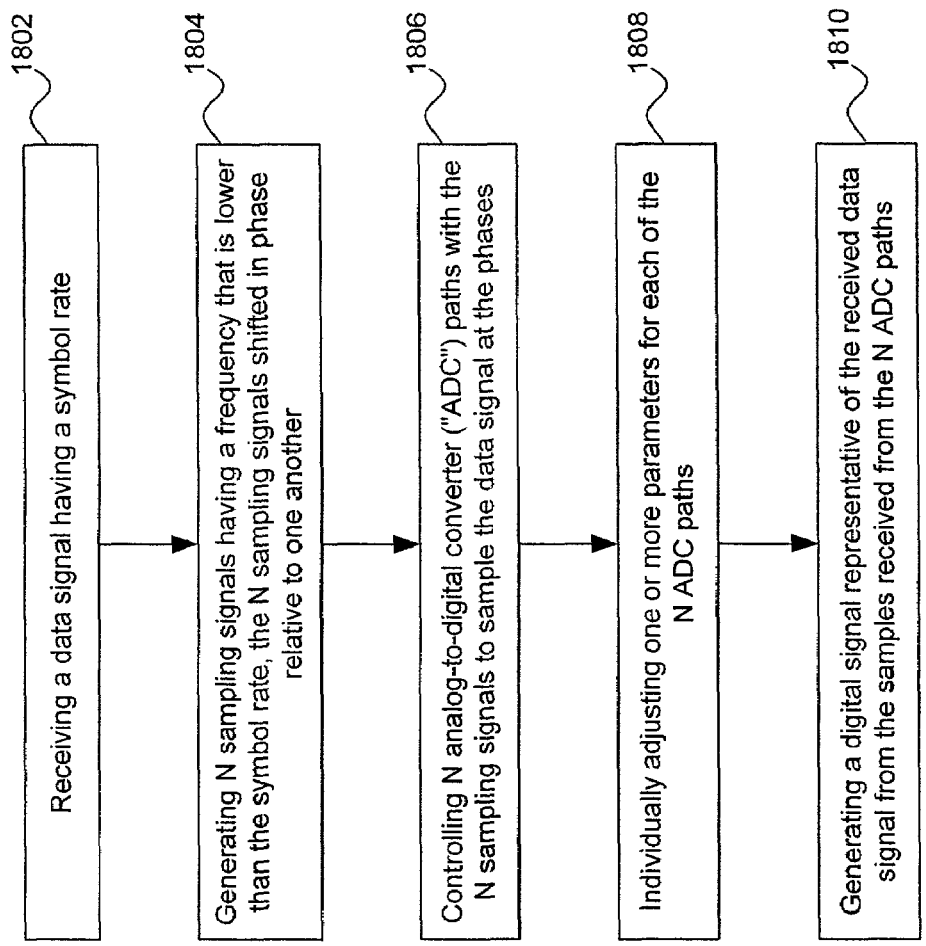
FIG. 18 is a process flowchart in accordance with an aspect of the invention.

FIG. 18 illustrates a process flowchart 1800 for implementing the present invention. For exemplary purposes, the process flowchart 1800 is described below with reference to one or more of the example system implementations illustrated in one or more of the drawing FIGS. 1–17. The present invention is not, however, limited to the example system implementations illustrated in drawing FIGS. 1–17. Based on the description herein, one skilled in the relevant art(s) will understand that the process flowchart 1800 can be implemented with other system implementations as well. Such other implementations are within the spirit and scope of the present invention.

The process begins with step 1802, which includes receiving a data signal having a symbol rate. For example, in FIG. 1, a data signal 102 is received through transmission medium 112.

Step 1804 includes generating N sampling signals having a frequency that is lower than the symbol rate, the N sampling signals shifted in phase relative to one another. For example, FIG. 3A illustrates a timing recovery module 318, which generates N timing control signals 319-1 through 319-N, as illustrated in FIG. 3C. The timing control signals 319-1 through 319-N have a lower frequency than the symbol rate of the received signal, and are staggered in phase from one another, as described above.

Step 1806 includes controlling N analog-to-digital converter ("ADC") paths with the N sampling signals to sample the data signal at the phases. This is described above, for example, with respect to FIG. 3A.

Step 1808 includes individually adjusting one or more parameters for each of the N ADC paths. Step 1810 can include, without limitation, individually adjusting each of the N sampling signals to reduce sampling phase errors in the N ADC paths, individually adjusting for offsets in the N ADC paths, and/or individually adjusting for gain errors in said N ADC paths.

Step 1810 includes generating a digital signal representative of the received data signal from samples received from the N ADC paths. In FIG. 1, this is illustrated by the output digital signal(s) 106.

Steps 1802 through 1810 are illustrated as discrete sequential steps for illustrative purposes. Steps 1802 through 1810 are not, however, limited to performance in discrete sequential steps. In practice, one or more of steps 1802 through 1810 are typically performed in other sequences, and/or using feedback from the same step, and/or using input and/or feedback from one or more other steps.

VII. Conclusions

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software, and the like, and/or combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for receiving data signals, comprising the steps of:
   (a) receiving a data signal having a symbol rate;
   (b) generating N sampling signals having a first frequency that is lower than said symbol rate, said N sampling signals shifted in phase relative to one another;
   (c) controlling N analog-to-digital converter ("ADC") paths with said N sampling signals to sample said data signal at said phases;
   (d) individually adjusting one or more parameters for each of said N ADC paths, including individually adjusting said N sampling signals to reduce phase errors between said received data signal and each of said N sampling signals in said N ADC paths; and
   (e) generating a digital signal representative of said received data signal from samples received from said N ADC paths.

2. The method according to claim 1, wherein step (b) comprises the steps of:
   (i) generating P clock signals having a second frequency that is approximately equal to said first frequency, said P clock signals shifted in phase relative to one another;
   (ii) generating N sets of digital control signals; and
   (iii) weighing said P clock signals under control of each of said set N digital control signals, thereby generating each of said N sampling signals; and
   wherein step (d) comprises the steps of:
   (i) determining phase errors between each of said N sampling signals and said received data signal in each of said N ADC paths; and (ii) individually adjusting said N sets of digital control signals to individually adjust for said phase errors in said N sampling signals.

3. The method according to claim 1, wherein step (b) comprises the steps of:
   (i) generating P clock signals having a second frequency approximately equal to said first frequency, said P clock signals shifted in phase relative to one another;
   (ii) generating N sets of digital control signals; and
   (iii) interpolating between different sets of said P clock signals under control of said N sets of digital control signals, thereby generating said N sampling signals; and
   wherein step (d) comprises the steps of:
   (i) determining phase errors between each of said N sampling signals and said received data signal in each of said N ADC paths; and
   (ii) individually adjusting said N sets of digital control signals to individually adjust for said phase errors in the N sampling signals.

4. The method according to claim 1, wherein step (d) comprises the step of individually adjusting for offsets in each of said N ADC paths.

5. The method according to claim 4, wherein step (d) further comprises the step of measuring said offsets in a digital domain and individually adjusting for said offsets in said digital domain for each of said N ADC paths.

6. The method according to claim 5, wherein step (d) further comprises the step of measuring said offsets in an M-path parallel decision feedback equalizer ("DFE") and individually adjusting one or more DFE DC taps associated with each of said N ADC paths.

7. The method according to claim 4, wherein step (d) further comprises the step of measuring said offsets in a digital domain and individually adjusting for said offsets in an analog domain for each of said N ADC paths.

8. The method according to claim 7, wherein step (d) further comprises the step of measuring said offsets in an M-path parallel decision feedback equalizer ("DFE") and individually adjusting analog compensation in each of said N ADC paths.

9. The method according to claim 4, wherein step (d) further comprises the step of measuring said offsets in an analog domain and individually adjusting for said offsets in said analog domain for each of said N ADC paths.

10. The method according to claim 1, wherein step (d) comprises the step of individually adjusting for gain errors in said N-ADC paths.

11. The method according to claim 10, wherein step (d) further comprises the step of measuring said gain errors in a digital domain and individually adjusting for said gain errors in said digital domain for each of said NADC paths.

12. The method according to claim 11, wherein step (d) further comprises the step of measuring said gain errors in an M-path parallel feed-forward equalizer ("FFE") and individually adjusting one or more FFE gain taps associated with each of said N ADC paths.

13. The method according to claim 10, wherein step (d) further comprises the step of measuring said gain errors in a digital domain and individually adjusting for said gain errors in an analog domain for each of said N ADC paths.

14. The method according to claim 13, wherein step (d) further comprises the step of generating digital control signals for each of said N ADC paths and individually adjusting programmable gain amplifiers associated with said N ADC paths under control of said digital control signals.

15. The method according to claim 1, wherein step (d) comprises one or more of the following:
   (i) individually adjusting said N sampling signals to reduce phase errors in said N ADC paths;
   (ii) individually adjusting for offsets in each of said N ADC paths; and
   (iii) individually adjusting for gain errors in said N-ADC paths.

16. The method according to claim 1, wherein step (d) comprises generating a decision-directed error signal, and step (e) comprises individually adjusting one or more parameters for each of said N ADC paths to reduce said decision-directed error signal.

17. The method according to claim 16, wherein step (d) further comprises generating a decision with a slicer and subtracting said decision from said samples.

18. The method according to claim 16, wherein step (d) further comprises providing a decision from a Viterbi detector to a channel estimator, and subtracting an output from said channel estimator from said samples.

19. The method according to claim 18, wherein step (d) further comprises providing a tentative decision from a Viterbi detector to said channel estimator.

20. The method according to claim 18, wherein step (d) further comprises providing a final decision from a Viterbi detector to said channel estimator.

21. The method according to claim 1, wherein step (d) comprises generating a non-decision-directed error signal, and step (e) comprises individually adjusting one or more parameters for each of said N ADC paths to reduce said non-decision-directed error signal.

22. The method according to claim 1, wherein step (e) further comprises using a feed-forward equalizer as a phase interpolator to individually adjust said N sampling signals.

23. The method according to claim 1, wherein step (d) comprises performing an equalization process to compensate for one or more of:
   (i) cross-talk;
   (ii) inter-symbol interference;
   (iii) attenuation; and
   (IV) noise.

24. The method according to claim 1, further comprising performing one or more digital processes on said samples and generating control signals from said one or more digital processes, wherein said control signals are used to perform said individually adjusting step (d).

25. The method according to claim 1, further comprising performing one or more M-path parallel digital processes on said samples, wherein M=kN, and k is an integer or a number in the form of 1/s, where s is an integer, and generating control signals from said one or more M-path parallel digital processes, wherein said control signals are used to perform said individually adjusting step (d).

26. A receiver, comprising:
   a receiver input;
   an analog-to-digital converter ("ADC") array of N ADC paths, wherein N is an integer greater than 1, each said ADC path including an ADC path input coupled to said receiver input;
   an M-path DSP coupled to said ADC array, wherein M=kN and k is an integer or a number in the form of 1/s, where s is an integer;
   said M-path DSP having a timing recovery module, wherein said timing recovery module recovers N sampling clocks from a data signal received at said receiver input, said data signal having a baud frequency, said N sampling clocks having a first frequency that is N times lower than said baud frequency, said N sampling clocks being shifted in phase relative to one another, whereby said timing recovery module provides said N sampling clocks to said N ADC paths, whereby said N sampling clocks control said N ADC paths to sample said received signal at said phases; and means for individually adjusting one or more parameters for each of said N ADC paths, including means for adjusting each of said N sampling signals to reduce sampling phase errors in said N ADC paths.

27. The receiver according to claim 26, wherein said means for individually adjusting one or more parameters for each of said N ADC paths comprises N timing recovery loops within said timing recovery module, each of said N timing recovery loops including an output coupled to a corresponding one of said N ADC paths, whereby each said timing recovery loop determines a sampling phase error in said corresponding one of said N ADC paths and individually adjusts a corresponding one of said N sampling signals to reduce said sampling phase error.

28. The receiver according to claim 27, further comprising:

a frequency divider that outputs P clock signals having a second frequency that is approximately equal to said first frequency and with substantially equal phase differences between said P clock signals, wherein P is at least 3; and a phase interpolator that includes P phase inputs, wherein said phase interpolator generates said N sampling clocks from said P clock signals, wherein N need not equal to P, wherein each said timing recovery loop generates a phase interpolator control signal, said phase interpolator including N phase adjusters whereby each said N phase adjuster adjusts a phase of a corresponding one of said N sampling clocks under control of a corresponding one of said timing recovery loop phase interpolator control signals to reduce said sampling phase error in a corresponding one of said ADC paths.

29. The receiver according to claim 28, wherein P is greater than N.

30. The receiver according to claim 28, wherein P is less than N.

31. The receiver according to claim 28, wherein said phase interpolator comprises a digital-to-analog converter ("DAC").

32. The receiver according to claim 31, wherein said phase interpolator control signals are digital phase interpolator control signals and wherein each of said N phase adjusters comprises:

a digital decoder coupled to a corresponding one of said N timing recovery loops;

P digital-to-analog converters, each coupled to said decoder;

means for weighting each of said P clock signals under control of said P digital-to-analog converters; and means for summing outputs of said means for weighting, whereby an output of said means for summing is one of said N sampling clock outputs.

33. The receiver according to claim 32, wherein said means for weighting comprises P differential pairs of NMOS transistors, each said pair of NMOS transistors having gate terminals coupled to a corresponding differential pair of one of said P phases, source terminals coupled to a corresponding one of said digital-to-analog converters, and drain terminals coupled to said means for summing.

34. The receiver according to claim 28, wherein said phase interpolator comprises a resistive interpolation ring.

35. The receiver according to claim 27, wherein:

k is an integer;

each of said M DSP paths include k decision generators and k slicer error generators, wherein said decision generator outputs decisions for a corresponding DSP path and said error generator outputs slicer errors for said corresponding DSP path; and each said timing recovery loop includes k phase detectors, each said phase detector including decision and error inputs coupled to decision and error outputs of said DSP paths, whereby said k phase detectors determine phase differences between said input data signal and a local reference clock, each said timing recovery loop including a summer having inputs coupled to outputs of said k phase detectors, whereby said summers add the phase differences determined by said phase detectors, each said timing recovery loop including a phase locked loop having an input coupled to an output of said summer, whereby said phase locked loops generate said phase interpolator control signals to minimize corresponding phase differences between said input data signal and said local reference clock.

36. The receiver according to claim 35, wherein k is equal to one, M equals N, and M and N are greater than 1, and wherein:

each of said M DSP paths include a decision generator and a slicer error generator; and each of said N timing recovery loops include a phase detector, each said phase detector including a decision input coupled to a corresponding DSP path decision generator output, each said phase detector including a slicer error input coupled to a DSP path slicer error generator output in a DSP path adjacent to said corresponding DSP path.

37. The receiver according to claim 35, wherein:

k is equal to two, N equals 4, and M equals 8;

said four ADC paths consecutively sample a received data signal at approximately 90 degree phase intervals;

each said M DSP path includes two decision generators and two slicer error generators;

each said timing recovery loop includes first and second phase detectors, wherein;

said first phase detector of a first one of said N timing recovery loops is coupled to a decision generator output of a first one of said M DSP paths and to a slicer error generator output of an eighth one of said DSP paths;

said second phase detector of said first timing recovery loop is coupled to a decision generator output of a fifth one of said M DSP paths and to a slicer error generator output of a fourth one of said M DSP paths;

said first phase detector of a second one of said N timing recovery loops is coupled to a decision generator output of a second one of said M DSP paths and to a slicer error generator output of said first DSP path;

said second phase detector of said second timing recovery loop is coupled to a decision generator output of a sixth one of said M DSP paths and to a slicer error generator output of said fifth DSP path;

said first phase detector of a third second one of said N timing recovery loops is coupled to a decision generator output of a third one of said M DSP paths and to a slicer error generator output of said second DSP path;

said second phase detector of said third timing recovery loop is coupled to a decision generator output of a seventh one of said M DSP paths and to a slicer error generator output of said sixth DSP path;

said first phase detector of a fourth one of said N timing recovery loops is coupled to a decision generator output of said eighth DSP path and to a slicer error generator output of said seventh DSP path; and said second phase detector of said fourth timing recovery loop is coupled to a decision generator output of said fourth DSP path and to a slicer error generator output said third DSP path.

38. The receiver according to claim 26, wherein k is an integer greater than 1, said M-path DSP including N sets of k inputs, each of said N sets of k inputs coupled to an output of a corresponding one of said N ADC paths.

39. The receiver according to claim 26, wherein said means for individually adjusting one or more parameters for each of said N ADC paths comprises means for individually adjusting for offsets in said N ADC paths.

40. The receiver according to claim 39, wherein said means for individually adjusting for offsets in said N ADC paths comprises digital measuring means for measuring said offsets and digital adjusting means for individually adjusting for said offsets.

41. The receiver according to claim 40, wherein said digital measuring means comprises an M-path parallel decision feedback equalizer ("DFE") in said M-path DSP, and said digital adjusting means comprises one or more DFE DC taps associated with each of said N ADC paths.

42. The receiver according to claim 39, wherein said means for individually adjusting for offsets in said N ADC paths comprises digital measuring means for measuring said offsets and analog adjusting means for individually adjusting for said offsets.

43. The receiver according to claim 42, wherein said digital measuring means comprises an M-path parallel decision feedback equalizer ("DFE") in said M-path DSP, and said analog adjusting means comprises means for individually adjusting analog compensation in each of said N ADC paths.

44. The receiver according to claim 39, wherein said means for individually adjusting for offsets in said N ADC paths comprises analog measuring means for measuring said offsets and analog adjusting means for individually adjusting for said offsets.

45. The receiver according to claim 26, wherein said means for individually adjusting one or more parameters for each of said N ADC paths comprises means for individually adjusting for gain errors in said N ADC paths.

46. The receiver according to claim 45, wherein said means for individually adjusting for gain errors in said N ADC paths comprises digital measuring means for measuring said gain errors and digital adjusting means for individually adjusting for said gain errors.

47. The receiver according to claim 46, wherein said digital measuring means comprises an M-path parallel feed-forward equalizer ("FFE") in said M-path DSP, and said digital adjusting means comprises one or more FFE gain taps associated with each of said N ADC paths.

48. The receiver according to claim 45, wherein said means for individually adjusting for gain errors in said N ADC paths comprises digital measuring means for measuring said gain errors and analog adjusting means for individually adjusting for said gain errors.

49. The receiver according to claim 48, wherein said analog adjusting means comprises N programmable gain amplifiers, each said programmable gain amplifier associated with a corresponding one of said N ADC paths.

50. The receiver according to claim 26, wherein said means for individually adjusting one or more parameters for each of said N ADC paths comprises one or more of the following:

means for individually adjusting each of said N sampling signals to reduce sampling phase errors in said N ADC paths;

means for individually adjusting for offsets in said N ADC paths; and means for individually adjusting for gain errors in said N ADC paths.

51. The apparatus according to claim 26, wherein said means for individually adjusting one or more parameters for each of said N ADC paths comprises:

(i) a decision-directed error signal generator that generates a decision-directed error signal; and (ii) at least one adaptive processor that adjusts said one or more parameters to reduce said decision-directed error signal.

52. The apparatus according to claim 51, wherein said decision-directed error signal generator comprises a slicer that receives samples of said received signal, and a subtractor that subtracts decisions from said slicer from said samples, wherein said subtractor outputs said decision-directed error signal.

53. The apparatus according to claim 51, wherein said decision-directed error signal generator comprises a Viterbi decoder that receives samples of said received signal, a channel estimator that receives decisions from said Viterbi decoder, and a subtractor that subtracts an output of said channel estimator from said samples, wherein said subtractor outputs said decision-directed error signal.

54. The apparatus according to claim 53, wherein said channel estimator receives final decisions from said Viterbi decoder.

55. The apparatus according to claim 53, wherein said channel estimator receives tentative decisions from said Viterbi decoder.

56. The apparatus according to claim 26, wherein said means for individually adjusting one or more parameters for each of said N ADC paths comprises:

a non-decision-directed error signal generator that generates a non-decision-directed error signal; and at least one adaptive processor that adjusts said one or more parameters to reduce said non-decision-directed error signal.

57. The apparatus according to claim 26, wherein said means for individually adjusting each of said N sampling signals comprises a feed-forward equalizer implemented as a phase interpolator to individually adjust said N sampling signals.

58. The apparatus according to claim 26, wherein said M-path DSP comprises an equalizer configured to compensate for one or more of:

cross-talk;

inter-symbol interference;

attenuation; and noise.

59. A method for receiving data signals, comprising the steps of:

(a) receiving a data signal having a symbol rate;

(b) generating N sampling signals having a first frequency that is lower than said symbol rate, said N sampling signals shifted in phase relative to one another;

(c) controlling N analog-to-digital converter ("ADC") paths with said N sampling signals to sample said data signal at said phases;

(d) performing one or more digital processes on samples from said N ADC paths and generating control signals from said one or more digital processes;

(e) individually adjusting one or more parameters for each of said N ADC paths using said control signals, including individually adjusting at least a sampling phase in each of said N ADC paths to compensate for phase errors between each said N sampling signals and said received data signal; and (f) generating a digital signal representative of said received data signal.

60. A method for receiving data signals, comprising the steps of:

(a) receiving a data signal having a symbol rate;

(b) generating N sampling signals having a first frequency that is lower than said symbol rate, said N sampling signals shifted in phase relative to one another;

(c) controlling N analog-to-digital converter ("ADC") paths with said N sampling signals to sample said data signal at said phases;

(d) performing one or more M-path parallel digital processes on samples from said N ADC paths, wherein M=kN, and k is an integer or a number in the form of 1/s where s is an integer, and generating control signals from said one or more M-path parallel digital processes;

(e) individually adjusting one or more parameters for each of said N ADC paths using said control signals, including individually adjusting at least a sampling phase in each of said N ADC paths to compensate for phase errors between each said N sampling signals and said received data signal; and (f) generating a digital signal representative of said received data signal.

61. A method for receiving data signals, comprising the steps of:

(a) receiving a data signal having a symbol rate;

(b) generating N sampling signals having a first frequency that is lower than said symbol rate, said N sampling signals shifted in phase relative to one another;

(c) controlling N analog-to-digital converter ("ADC") paths with said N sampling signals to sample said data signal at said phases;

(d) individually adjusting one or more parameters for each of said N ADC paths, including individually adjusting at least a sampling phase in each of said N ADC paths to compensate for phase errors between each said N sampling signals and said received data signal; and (e) generating a digital signal representative of said received data signal from samples received from said N ADC paths.

62. A method for receiving data signals, comprising the steps of:

(a) receiving a data signal having a symbol rate;

(b) generating N sampling signals having a first frequency that is lower than said symbol rate, said N sampling signals shifted in phase relative to one another;

(c) controlling N analog-to-digital converter ("ADC") paths with said N sampling signals to sample said data signal at said phases;

(d) performing one or more digital processes on samples from said N ADC paths and generating control signals from said one or more digital processes;

(e) individually adjusting one or more parameters for each of said N ADC paths using said control signals, including individually adjusting at least a sampling phase in each of said N ADC paths to compensate for phase errors between each said N sampling signals and said received data signal; and (f) generating a digital signal representative of said received data signal.

63. A method for receiving data signals, comprising the steps of:

(a) receiving a data signal having a symbol rate;

(b) generating N sampling signals having a first frequency that is lower than said symbol rate, said N sampling signals shifted in phase relative to one another;

(c) controlling N analog-to-digital converter ("ADC") paths with said N sampling signals to sample said data signal at said phases;

(d) performing one or more M-path parallel digital processes on samples from said N ADC paths, wherein M=kN, and k is an integer or a number in the form of 1/s, where s is an integer, and generating control signals from said one or more M-path parallel digital processes;

(e) individually adjusting one or more parameters for each of said N ADC paths using said control signals, including individually adjusting at least a sampling phase in each of said N ADC paths to compensate for phase errors between each said N sampling signals and said received data signal; and (f) generating a digital signal representative of said received data signal.

* * * * *

UNITED STATES PATENT AND TRADEMARK OFFICE
CERTIFICATE OF CORRECTION

PATENT NO.       : 7,245,638 B2                                        Page 1 of 1
APPLICATION NO.  : 10/085071
DATED            : July 17, 2007
INVENTOR(S)      : Agazzi et al.

It is certified that error appears in the above-identified patent and that said Letters Patent is hereby corrected as shown below:

Column 20
At line 41, please replace "(IV)" with --(iv)--.

Column 21
At line 31, please replace "equal" with --be equal--.

Signed and Sealed this

Eleventh Day of March, 2008

JON W. DUDAS
*Director of the United States Patent and Trademark Office*